United States Patent
Moon

(10) Patent No.: US 8,216,948 B2
(45) Date of Patent: Jul. 10, 2012

(54) EXPOSURE MASK AND METHOD FOR FORMING SEMICONDUCTOR DEVICE USING THE SAME

(75) Inventor: Jae In Moon, Seoul (KR)

(73) Assignee: Hynix Semiconductor Inc, Icheon (KR)

( * ) Notice: Subject to any disclaimer, the term of this patent is extended or adjusted under 35 U.S.C. 154(b) by 440 days.

(21) Appl. No.: 12/494,238

(22) Filed: Jun. 29, 2009

(65) Prior Publication Data

US 2010/0055910 A1 Mar. 4, 2010

(30) Foreign Application Priority Data

Aug. 29, 2008 (KR) ........................ 10-2008-0085301

(51) Int. Cl.
*H01L 21/302* (2006.01)

(52) U.S. Cl. .................... 438/717; 438/714; 438/725

(58) Field of Classification Search .................. 438/706, 438/710, 714, 717, 725; 430/299, 310, 5, 430/312
See application file for complete search history.

(56) References Cited

U.S. PATENT DOCUMENTS

| 7,473,647 | B2 | 1/2009 | Lee et al. |
| 7,601,647 | B2 | 10/2009 | Jeon et al. |
| 7,632,689 | B2 * | 12/2009 | Hoster et al. ..................... 438/8 |
| 2004/0188797 | A1 * | 9/2004 | Khater et al. ................. 257/510 |
| 2004/0253525 | A1 * | 12/2004 | Kanai ................. 430/5 |
| 2006/0240361 | A1 | 10/2006 | Lee et al. |
| 2006/0281210 | A1 * | 12/2006 | Kiuchi et al. ................... 438/30 |

FOREIGN PATENT DOCUMENTS

KR 1020060113162 A 11/2006

* cited by examiner

*Primary Examiner* — Lan Vinh

(57) ABSTRACT

Disclosed herein is a method for forming a semiconductor device that stacks an etched layer and a first hard mask layer on a semiconductor substrate, patterns the first hard mask layer in a high density region and a low density region, using a first exposure mask, forms a first spacer on a sidewall of the first hard mask layer in the high density region, forms a second spacer on a sidewall of the first hard mask layer in the low density region at the same time, etches an end with the first spacer connected thereto using a second exposure mask to thereby form a first spacer pattern, forms a planarized second hard mask layer that exposes the first spacer pattern and the second spacer, removes the first spacer pattern and the second spacer such that the second hard mask layer is left, and etches the etched layer using the second hard mask layer as an mask. This method makes it possible to easily form a micro pattern in the high density region and the low density region.

13 Claims, 25 Drawing Sheets

EXPOSURE MASK AND METHOD FOR FORMING SEMICONDUCTOR DEVICE USING THE SAME

CROSS-REFERENCE TO RELATED APPLICATION

Priority to Korean patent application No. 10-2008-0085301, filed on Aug. 28, 2008, the disclosure of which is incorporated herein by reference in its entirety, is claimed.

BACKGROUND OF THE INVENTION

The present invention relates to a method for forming a semiconductor device, and more particularly, to a technique for forming a contact hole or a bar-type pattern in a high density region and a low density region in a memory device such as a DRAM and a flash memory device.

In general, a lithography process, which is carried out in a process for forming a semiconductor device, uses a mask to form a circuit and design structure. Many problems occur due to a shrunk pattern size required for high integration of the semiconductor device.

It is difficult to form a pattern in a size smaller than the resolution limit of a lithography device employed.

BRIEF SUMMARY OF THE INVENTION

Various embodiments of the invention are directed to provide a method for forming a semiconductor device to form a micro pattern capable of overcoming a resolution limit, using a Spacer Patterning Technique (SPT).

According to an embodiment of the present invention, a method for forming a semiconductor device comprises: providing a target substrate a target substrate including a high density region and a low density region; forming an underlying layer and a first hard mask layer on the target substrate; patterning the first hard mask layer in the high density region and the low density region using a first exposure mask, the first exposure mask comprising a first exposure pattern formed in a first region corresponding to the high density region and a second exposure pattern formed in a second region corresponding to the low density region, the second exposure pattern and the first exposure pattern having different widths from each other; forming a first spacer on a sidewall of the first hard mask layer in the high density region and a second spacer on a sidewall of the first hard mask layer in the low density region at the same time; etching an end with the first spacer connected thereto using a second exposure mask to form a first spacer pattern; forming a planarized second hard mask layer that exposes the first spacer pattern and the second spacer; removing the first spacer pattern and the second spacer such that the second hard mask layer is left; and etching the underlying layer using the second hard mask layer as an etch mask.

Preferably, the method further comprises forming an antireflection film over the first hard mask layer.

Preferably, the first exposure pattern and the second exposure pattern may be contact hole patterns or bar patterns.

Preferably, the contact hole patterns may have an elliptical shape.

Preferably, a pitch of the second exposure pattern in the low density region may be less than that of the first exposure pattern in the high density region.

Preferably, a first spacer may be formed on a sidewall of the contact hole in the high density region, and a second spacer fills the contact hole in the low density region.

Preferably, the first spacer and the second spacer may be formed of insulating material or conductive material.

Preferably, the first and the second exposure patterns on the first exposure mask may be light transmitting patterns.

Preferably, the planarized second hard mask layer may be formed by a CMP process or an etchback process.

Preferably, the first and second exposure masks may be a binary mask, a phase shift mask or a half tone phase shift mask.

According to an embodiment of the present invention, a photomask for forming contact holes on a semiconductor device comprising: a first exposure mask comprising a first exposure pattern formed in a region corresponding to a high density region of the semiconductor substrate, and a second exposure pattern formed in a region corresponding to a low density region of the semiconductor substrate, the first exposure pattern and the second exposure pattern having different pitches from each other; and a second exposure mask comprising a third exposure pattern overlapping with at least some portion of the first exposure pattern, and a fourth exposure pattern substantially covering the low density region.

Preferably, the pitch of the second exposure pattern in the low density region may be less than that of the first exposure pattern in the high density region.

According to another embodiment of the present invention, a method for forming a semiconductor device comprises providing a target substrate including a high density region and a low density region; forming an underlying layer and a first hard mask layer over the high density region and the low density region of the target substrate; patterning the first hard mask layer over the target substrate to form a first hard mask pattern in the high density region and a second hard mask pattern in the low density region, the second hard mask pattern having a pitch that is less than a pitch of the first hard mask pattern; forming a second hard mask layer over the first hard mask pattern and the second hard mask pattern so that the second hard mask layer is filling an opening defined by the second hard mask pattern; patterning the second hard mask layer to form a first spacer on the sidewall of the first hard mask pattern and a second spacer filling in between neighboring second hard mask pattern; providing a third hard mask layer into an opening defined by the first spacers and an opening defined by the second spacers; removing the first spacer and the second spacer to obtain a third hard mask pattern in the high density region and a fourth hard mask pattern in the low density region; and patterning the underlying layer using the third and the fourth hard mask patterns to form a first contact hole in the high density region and a second contact hole in the low density region.

Preferably, the method further comprises tailoring the first spacer into a given shape and size using the second exposure mask.

Preferably, the first hard mask pattern and the second hard mask pattern may be a contact hole pattern or a bar pattern.

BRIEF DESCRIPTION OF THE DRAWINGS

FIGS. 4a to 4m are plane views and sectional views illustrating the method for forming the semiconductor device according to the first embodiment of the present invention;

DESCRIPTION OF EMBODIMENTS

Figure 1:
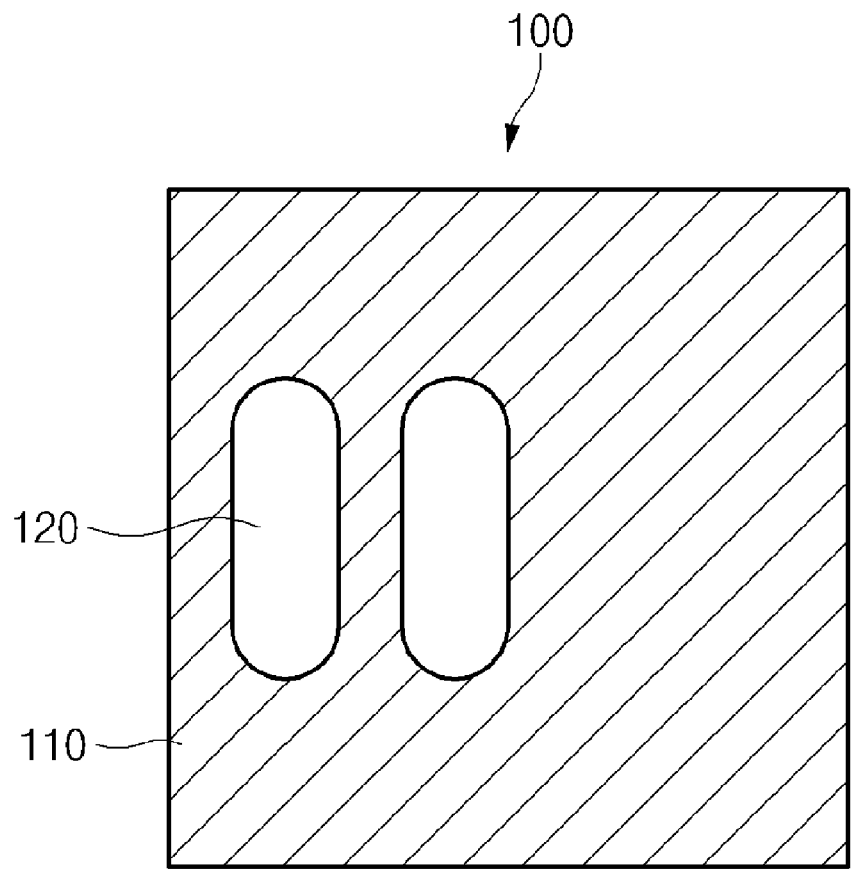
FIGS. 1 to 3 are plane views illustrating exposure masks used in a method for forming a semiconductor device according to a first embodiment of the present invention.

Hereinafter, a method for forming a semiconductor device according to the present invention will be described in detail with reference to the accompanying drawings. However, the present invention is not limited to the embodiments disclosed below but may be implemented into different forms. These embodiments are provided only for illustrative purposes and for full understanding of the scope of the present invention by those skilled in the art. In the following description, same drawing reference numerals are used for the same elements.

Figure 2:
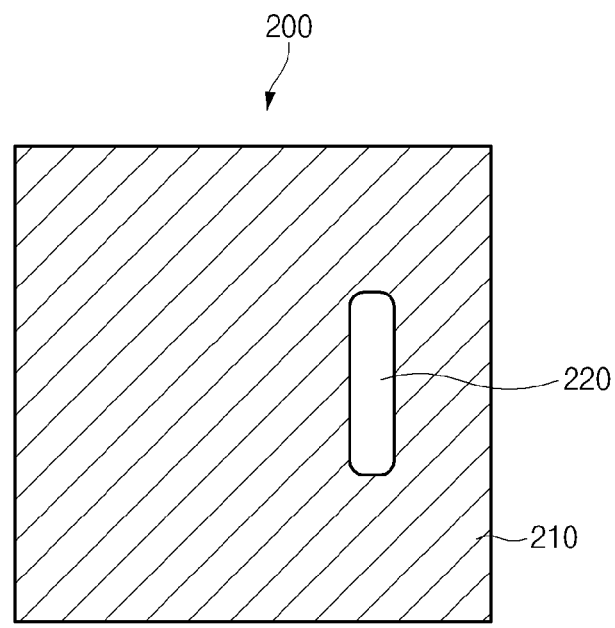
Figure 3:
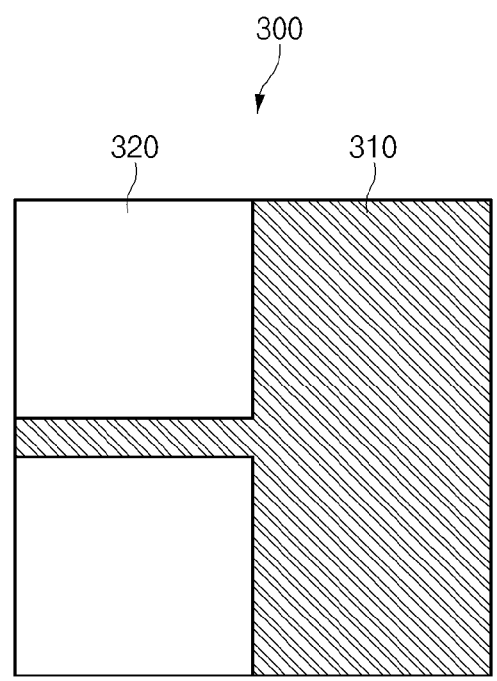

FIGS. 1 to 3 are plane views illustrating exposure masks used in a method for forming a semiconductor device according to a first embodiment of the present invention.

FIG. 1 illustrates a first exposure mask 100 designed to form a contact hole in a high density region (numeral 1000 of FIGS. 4a to 4m), where a light shielding region 110 and a light transmitting region 120 defining a contact hole are formed on a transparent substrate.

Referring to FIG. 1, the first exposure mask 100 forms a light shielding pattern, e.g., a chrome pattern, in the light shielding region 110 on a quartz substrate which is a transparent substrate.

FIG. 2 illustrates a second exposure mask 200 designed to form a contact hole in a low density region (numeral 2000 of FIGS. 4a to 4m), where a light shielding region 210 and a light transmitting region 220 made of a transparent substrate are formed.

FIG. 3 is a plane view illustrating a third exposure mask 300, where a light shielding region 310 is configured to shield a specific portion of the contact hole in the high density region formed using the first exposure mask 100 and the contact hole in the low density region.

Referring to FIG. 3, the light shielding region 310 is formed so as to shield the central portion of the contact hole positioned in the high density region.

Accordingly, the light shielding region 310 is configured in a line pattern running across the center of the first contact hole formed in the high density region (1000 of FIGS. 4a to 4m) and the entire low density region (numeral 2000 of FIGS. 4a to 4m).

FIGS. 4a to 4m illustrate the method for forming the semiconductor device according to the first embodiment of the present invention, where the lower figures are sectional views taken along line (a)-(a) of the top figures. In FIG. 4h, the upper figure is a plane view, the middle figure is a sectional view taken along line (a)-(a) of the plane view, and the lower figure is a sectional view taken along line (b)-(b) of the plane view. A high density region 1000 and a low density region 2000 are shown in each figure.

Figure 4A:
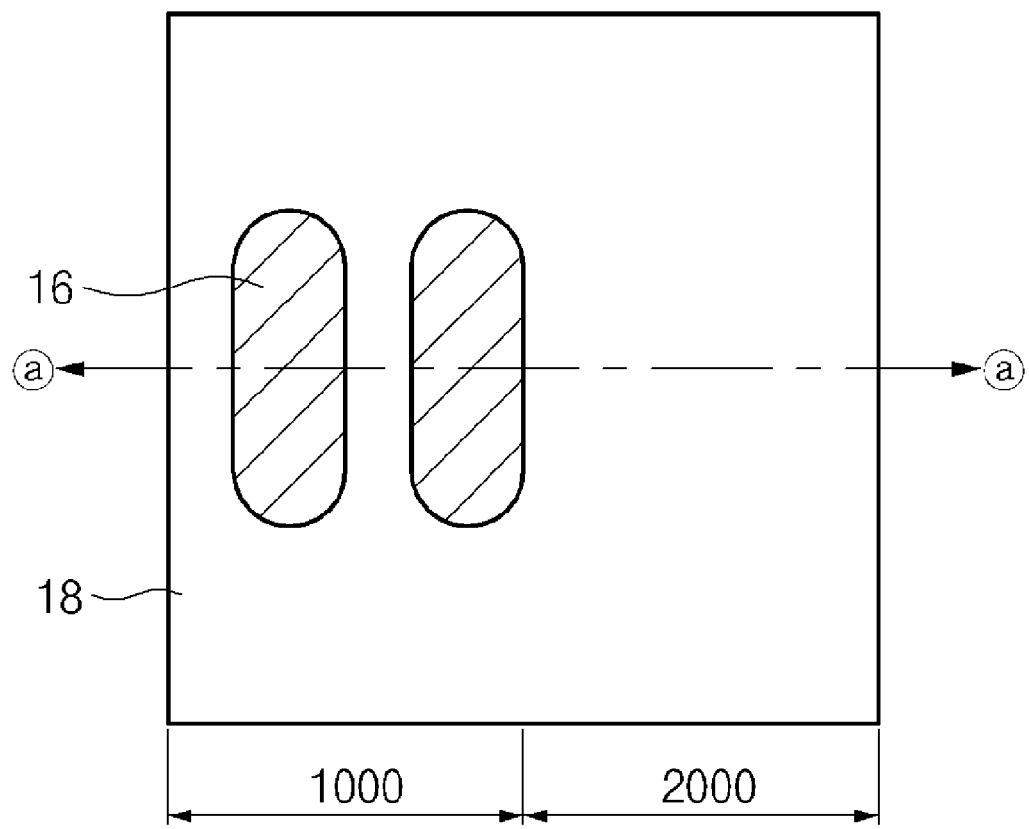
Figure 4A:
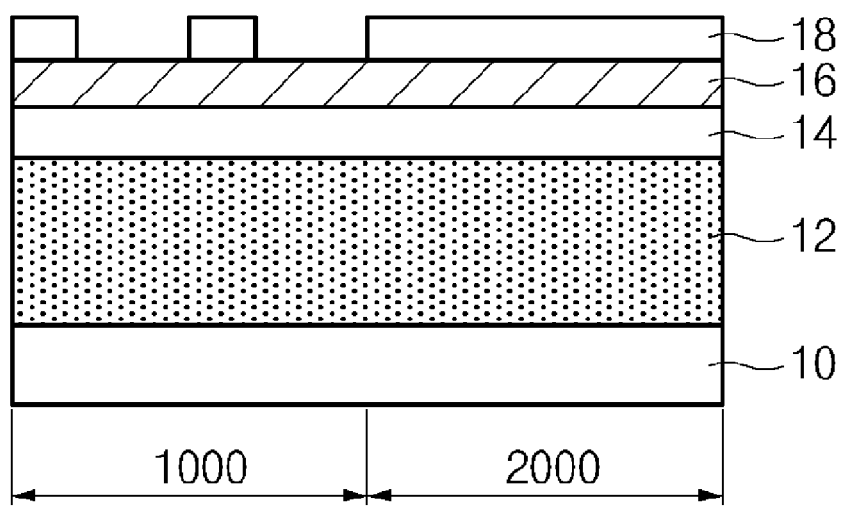

Referring to FIG. 4a, an underlying layer 12, a first hard mask layer 14, an anti-reflection film 16 and a first photoresist film pattern 18 are formed on a semiconductor substrate 10. Here, the first photoresist film pattern 18 is formed by an exposure and development process using the first exposure mask 100 of FIG. 1 so as to form a contact hole in the high density region 1000.

Figure 4B:
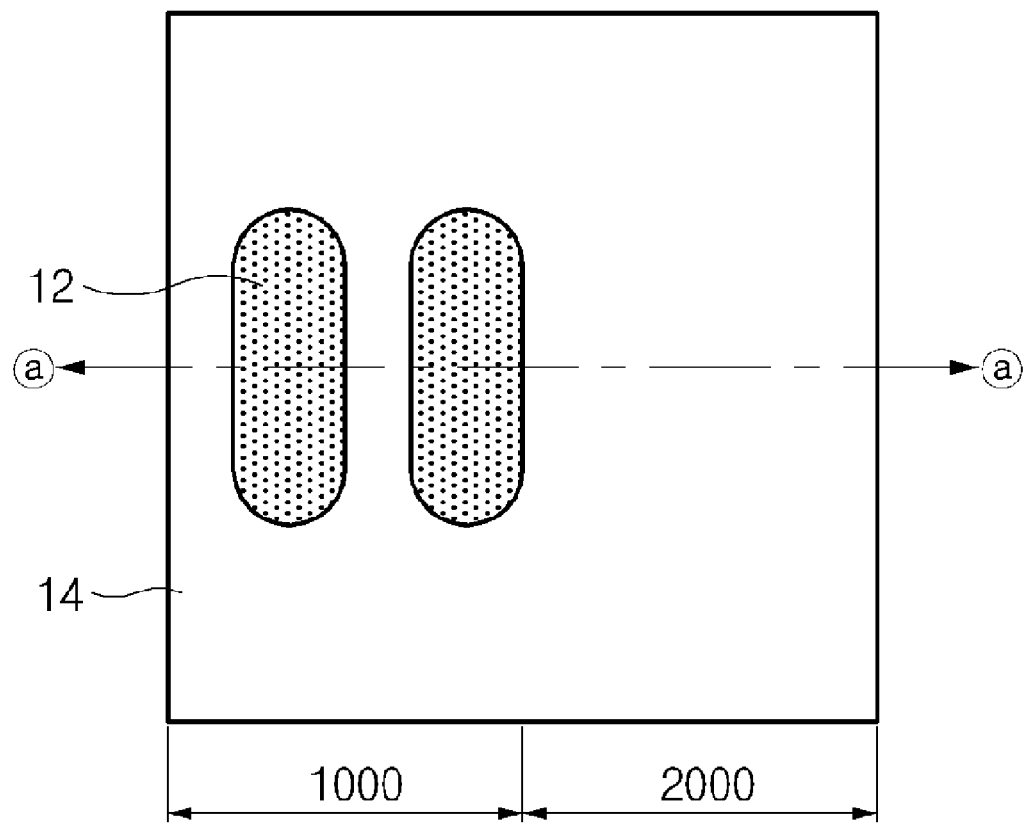
Figure 4B:
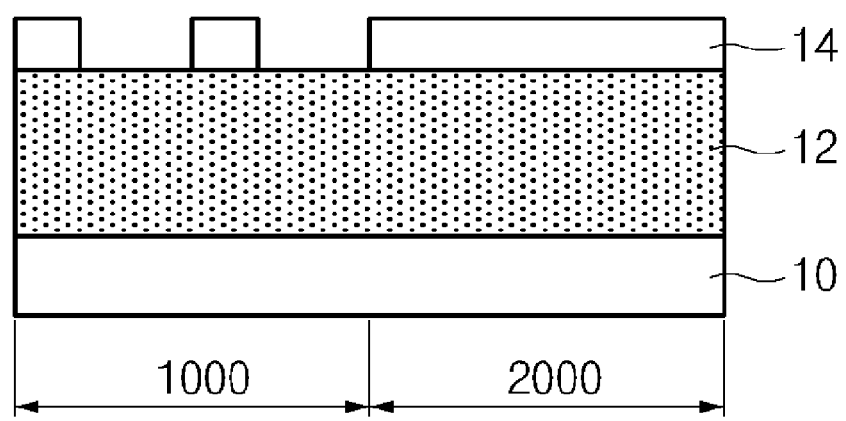

Referring to FIG. 4b, the anti-reflection film 16 and the first hard mask layer 14 are etched using the first photoresist film pattern 18 as a mask to form a first hard mask layer 14, thereby exposing the etched layer 12. Then, the first photoresist film pattern 18 and the anti-reflection film 16 are removed.

Figure 4C:
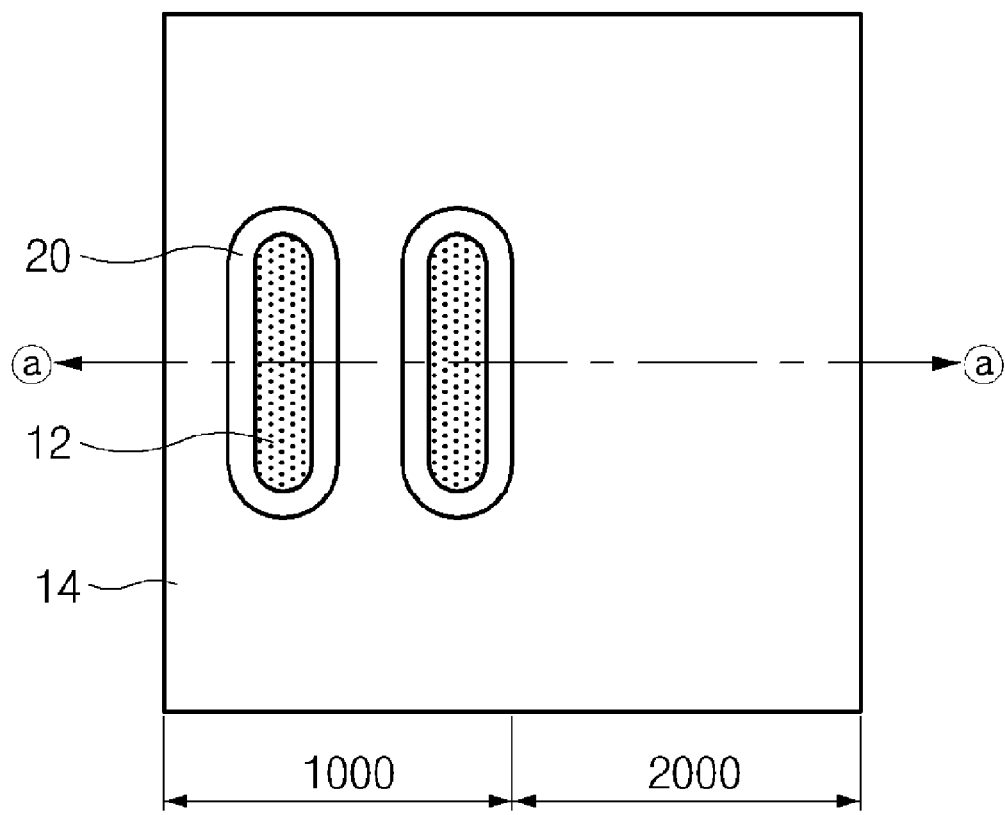
Figure 4C:
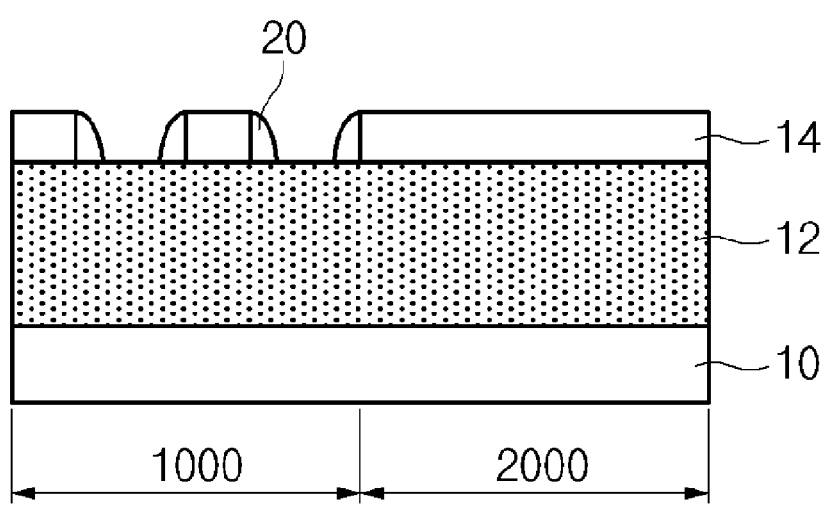

Referring to FIG. 4c, a spacer 20 is formed on a sidewall of the first hard mask layer 14. Specifically, a thin film such as insulating material and conductive material is formed on the high density region 1000 and the low density region 2000, and anisotropically etched to form the spacer 20. The insulating film may include an oxide material, a nitride material, or a stack thereof.

Figure 4D:
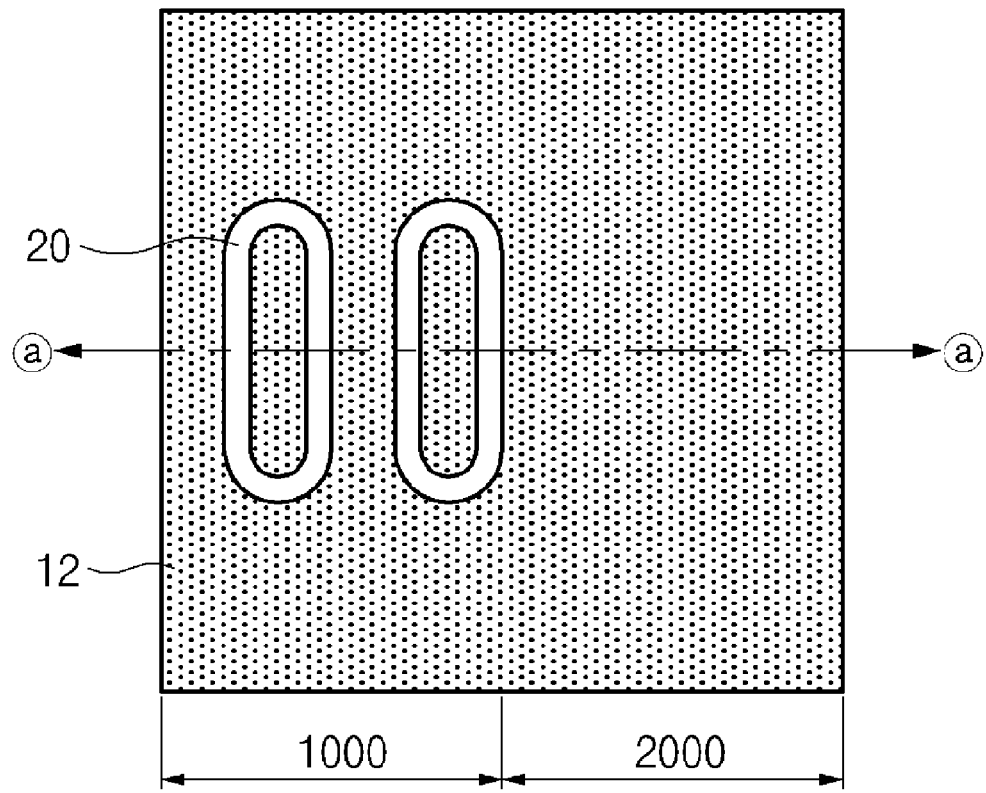
Figure 4D:
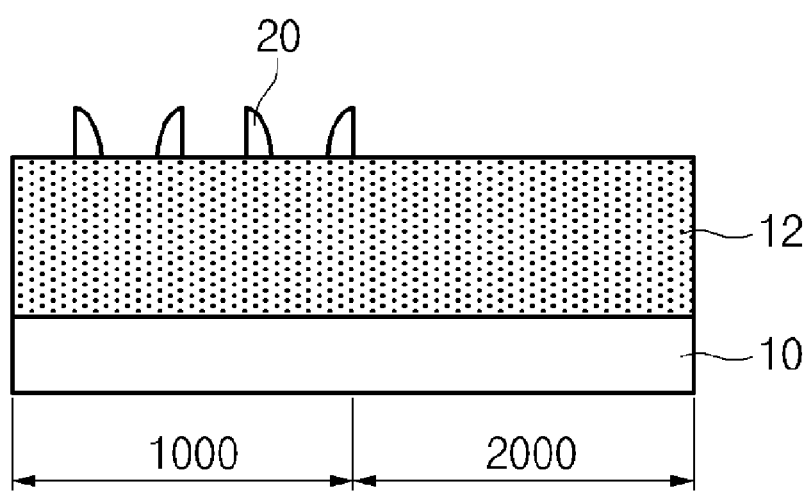

Referring to FIG. 4d, the first hard mask layer 14 is removed. The spacer 20 remains on the underlying layer 12. The spacer 20 is formed in the light transmitting region 120 of the first exposure mask 100 of FIG. 1.

Figure 4E:
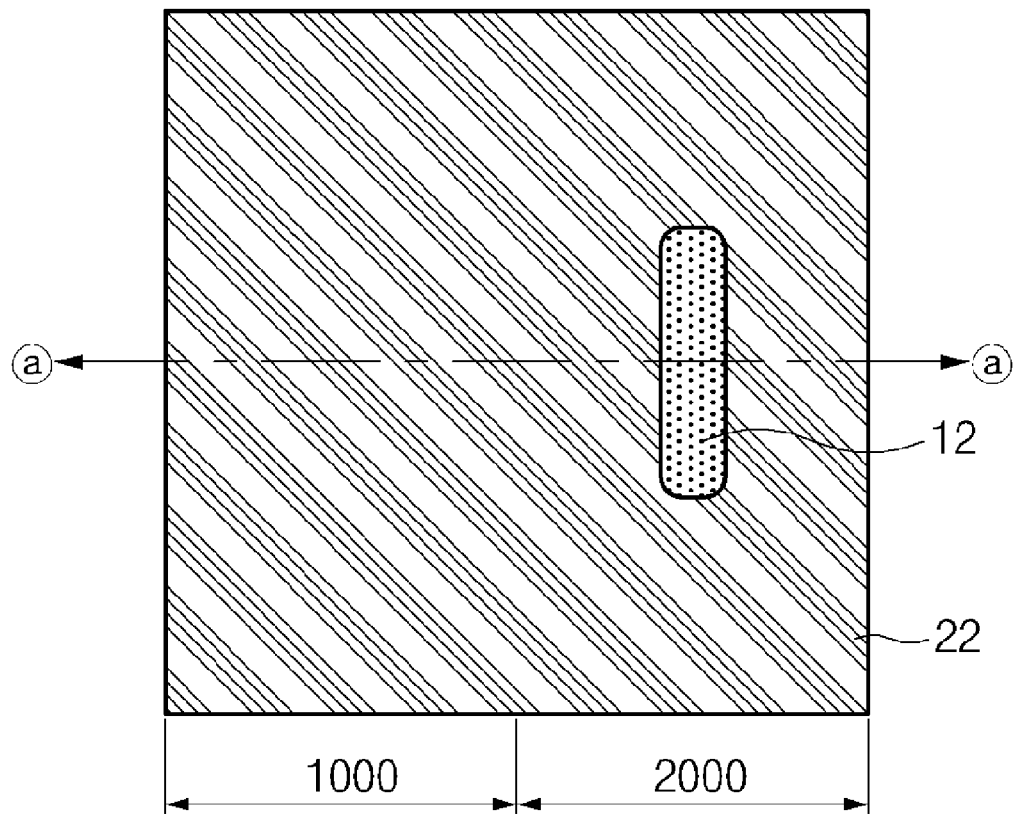
Figure 4E:
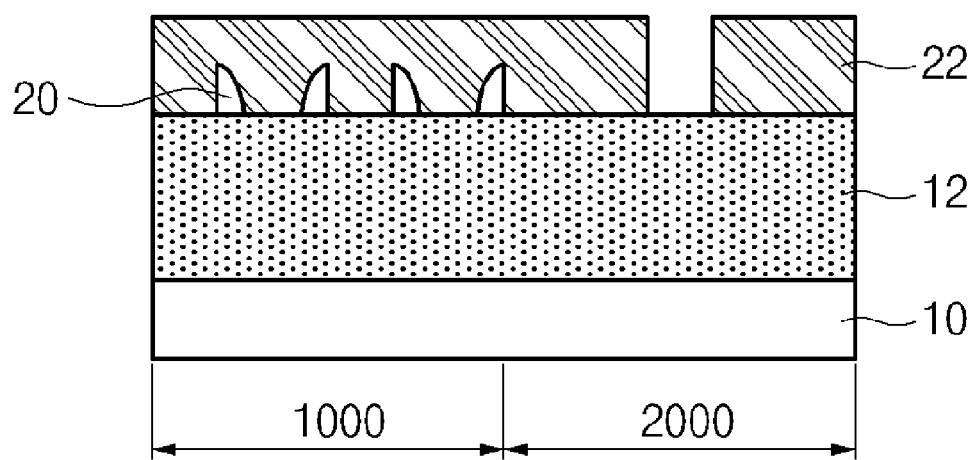

Referring to FIG. 4e, a second photoresist film pattern 22 is formed on the high density region 1000 and the low density region 2000. Here, the second photoresist film pattern 22 is formed by an exposure and development process using the second exposure mask 200 of FIG. 2 so as to form a contact hole in the low density region 2000.

Figure 4F:
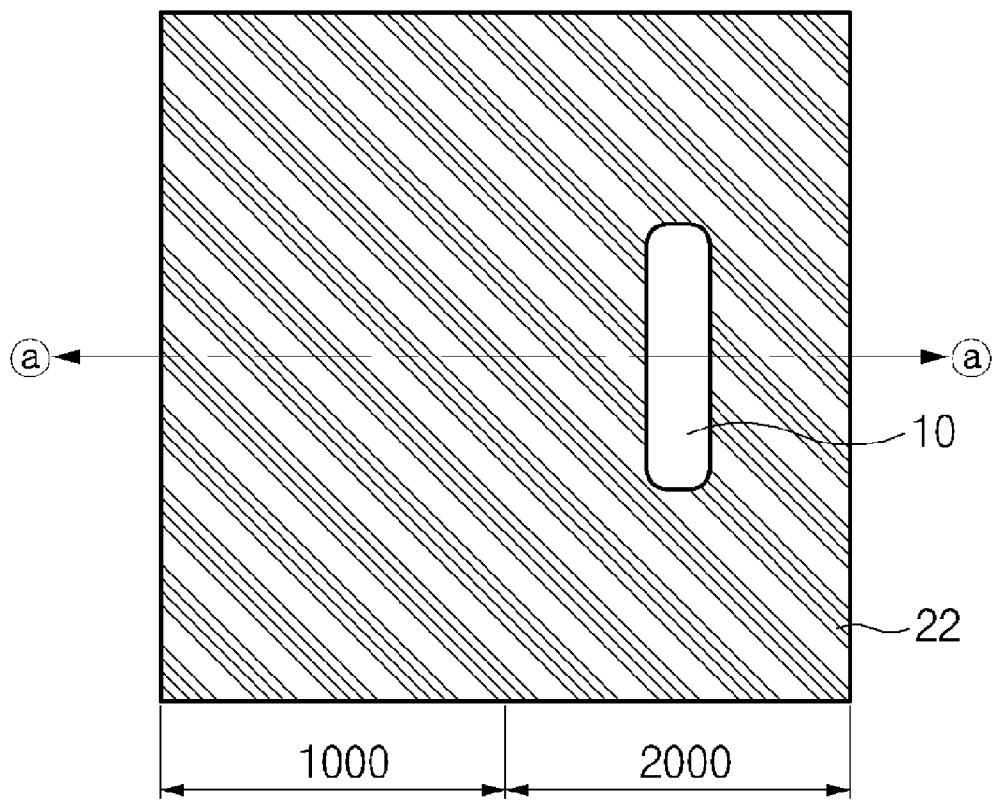
Figure 4F:
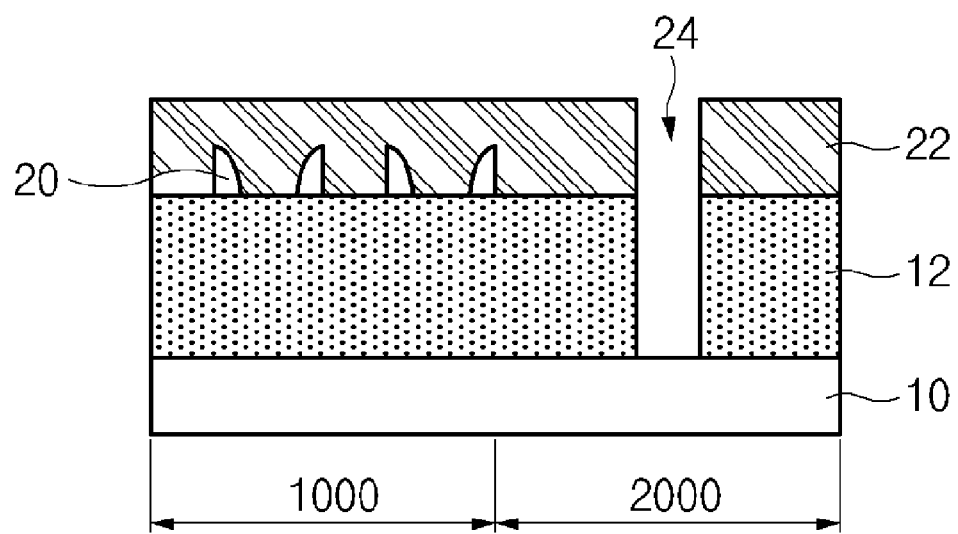

Referring to FIG. 4f, the underlying layer 12 is etched using the second photoresist film pattern 22 as a mask to form the first contact hole 24 exposing the semiconductor substrate 10. Here, the first contact hole 24 is formed in the low density region 2000, i.e., an independent region.

Figure 4G:
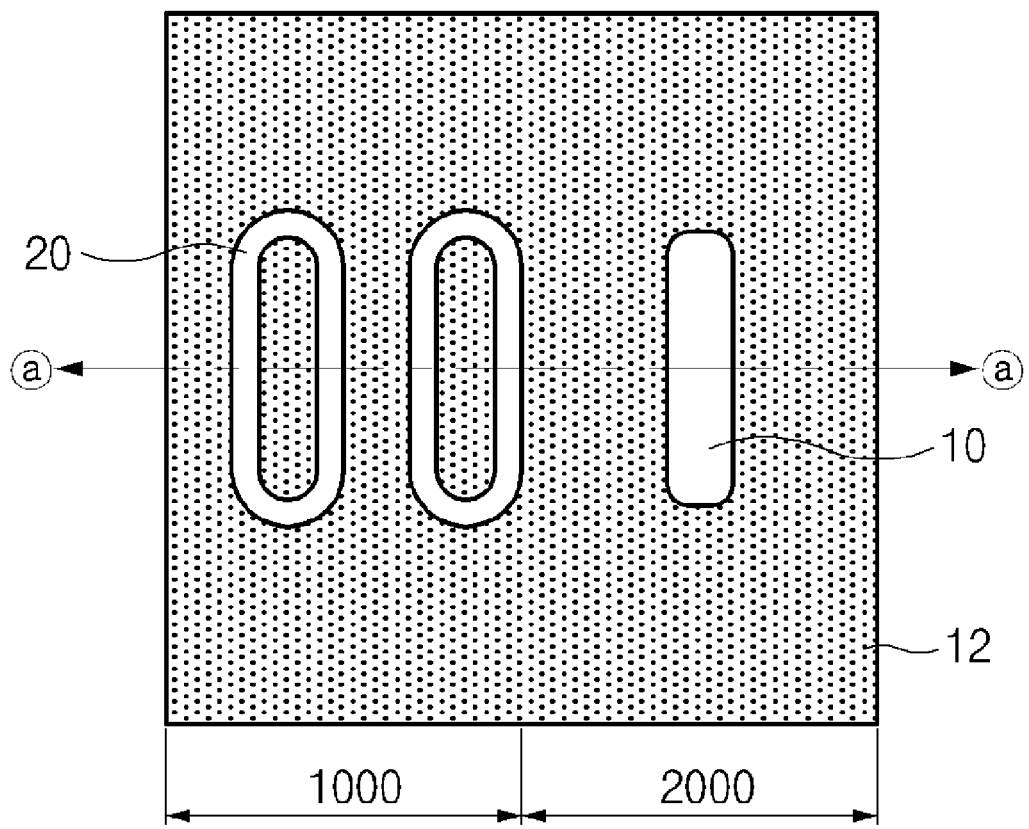
Figure 4G:
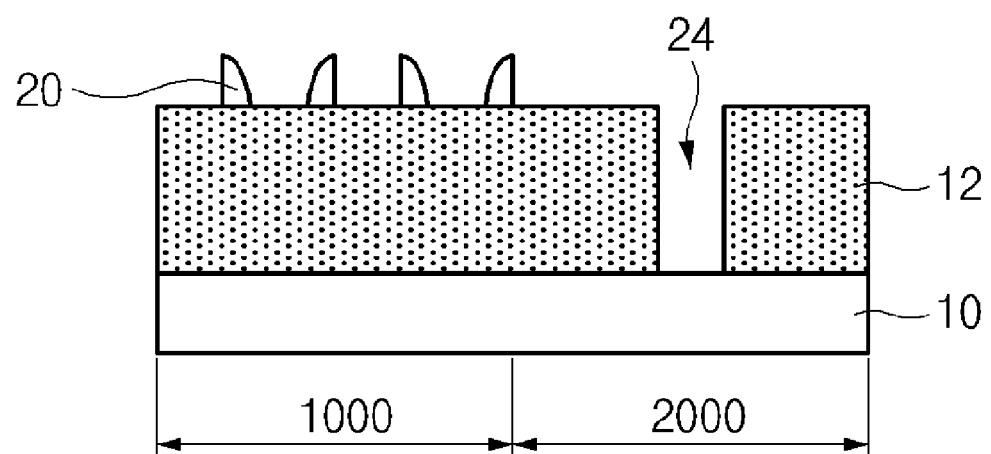
Figure 4H:
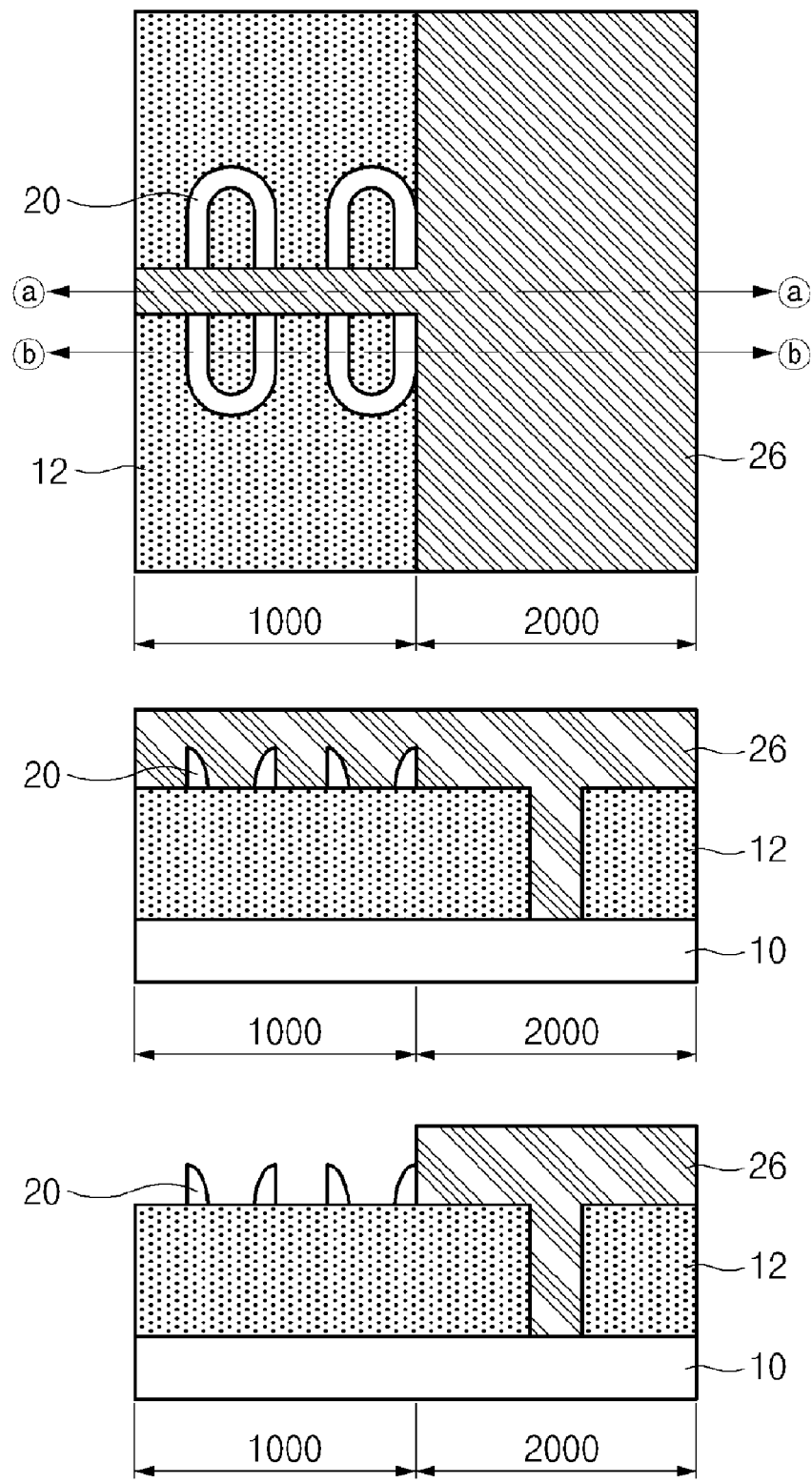

Referring to FIG. 4g, the second photoresist film pattern 22 is removed. The spacer 20 still remains in an elliptical shape in the high density region.

Referring to FIG. 4h, a third photoresist film pattern 26 is formed on the high density region 1000 and the low density region 2000. The third photoresist film pattern 26 is formed by an exposure and development process using the third exposure mask 300 of FIG. 3 to shield the line region running across the center of the spacer 20 in the high density region 1000 and to shield the entire low density region 2000. As a result, the spacer 20 in an elliptical shape is divided into two independent spacer 20.

Figure 4I:
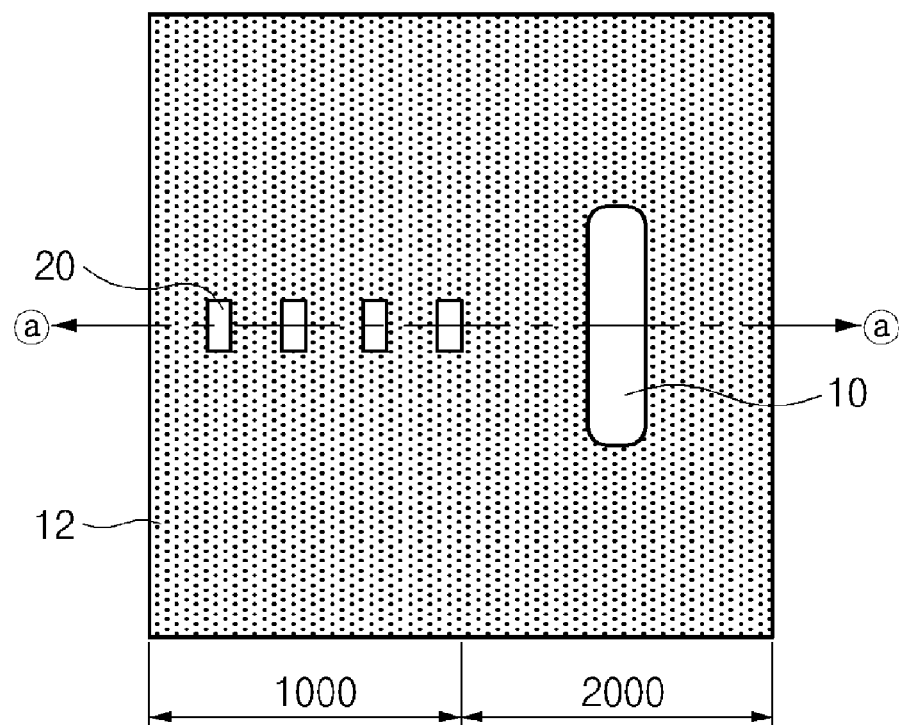
Figure 4I:
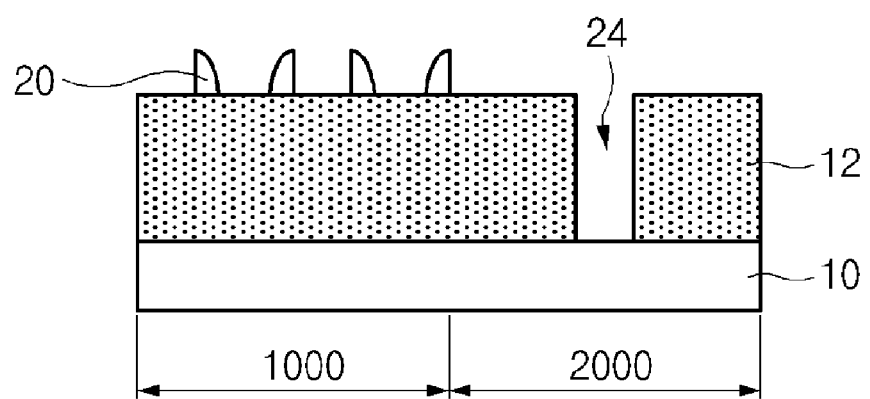

Referring to FIG. 4i, the third photoresist film pattern 26 is removed.

Figure 4J:
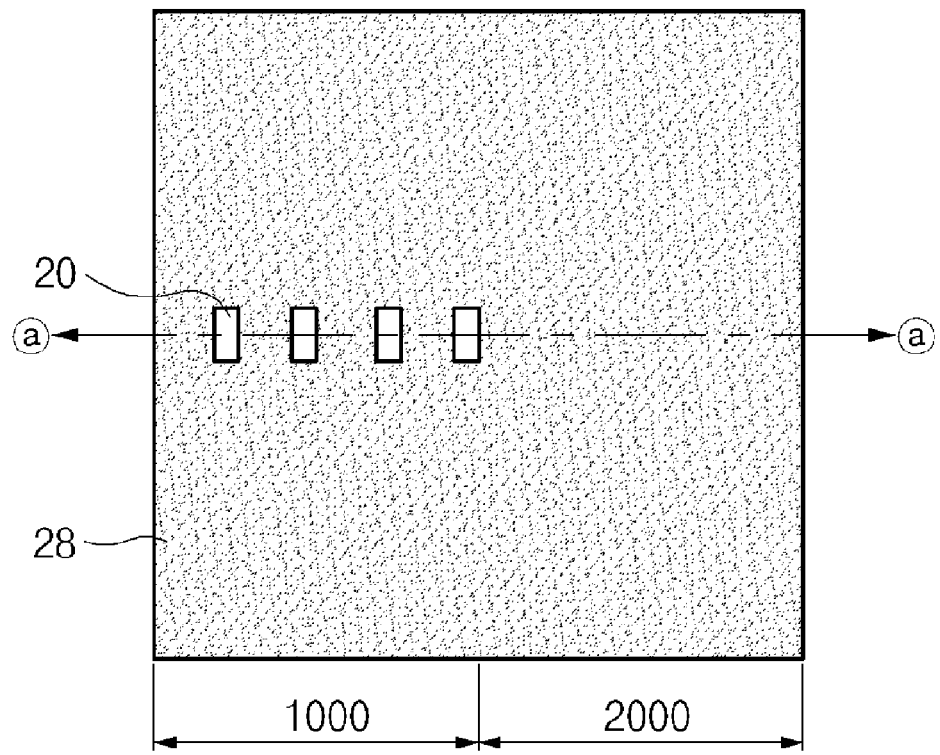
Figure 4J:
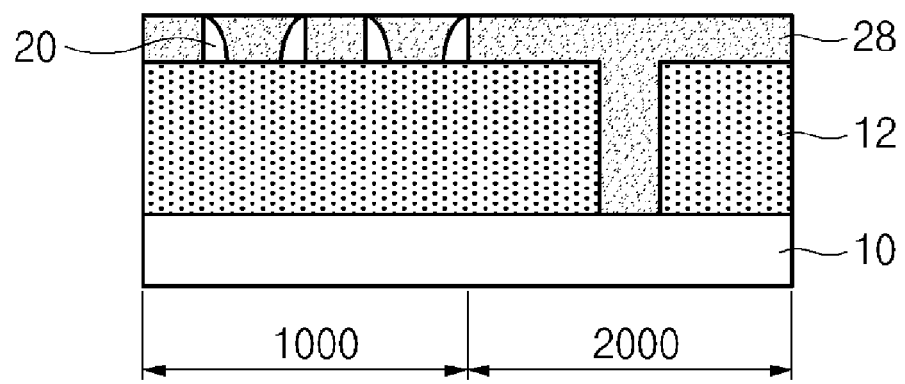

Referring to FIG. 4j, a second hard mask layer 28 is formed on the high density region 1000 and the low density region 2000. Thereafter, the second hard mask layer 28 is subject to planarization process until the spacer 20 is exposed. The planarization process may be implemented with a CMP process or an etchback process.

Figure 4K:
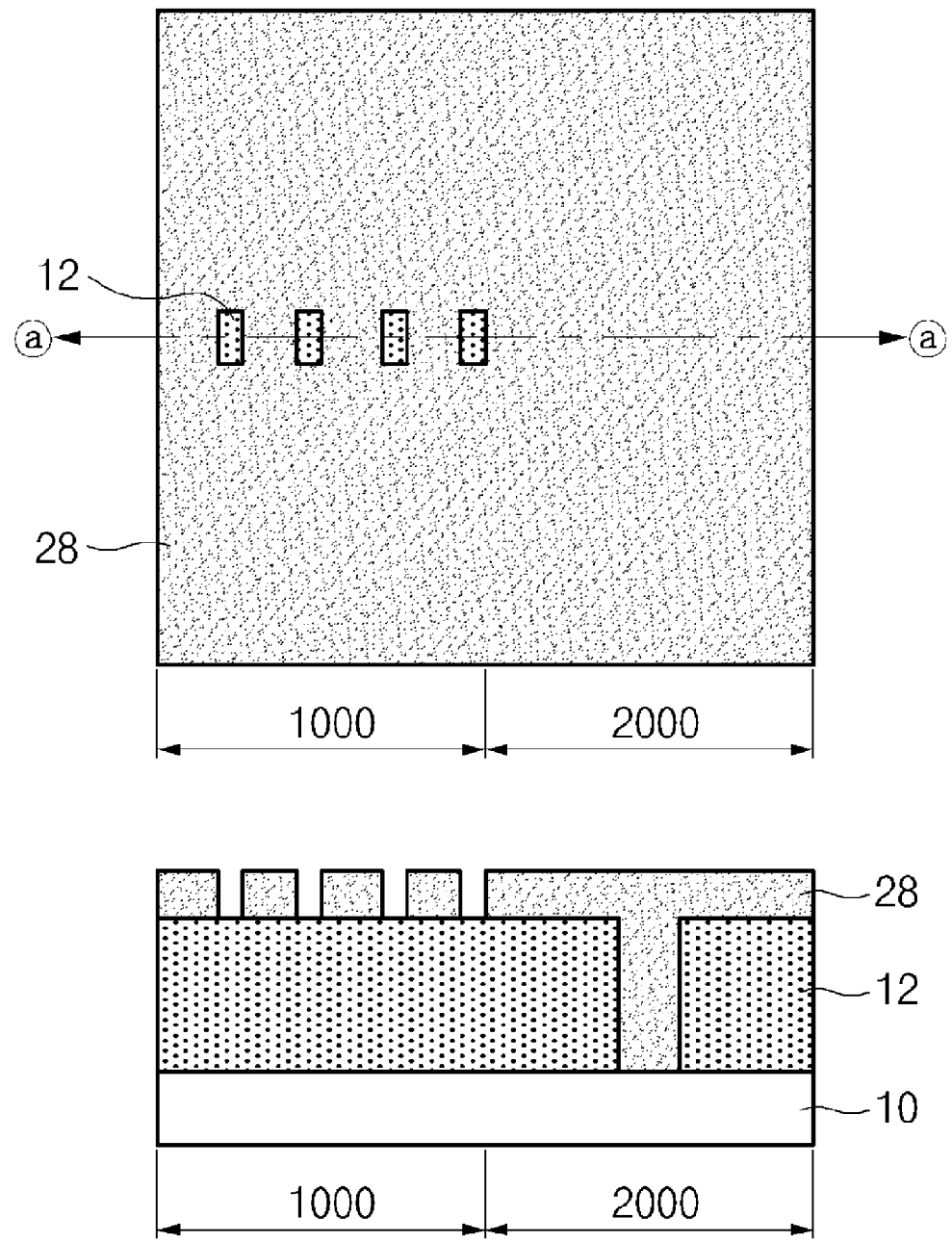
Figure 4I:
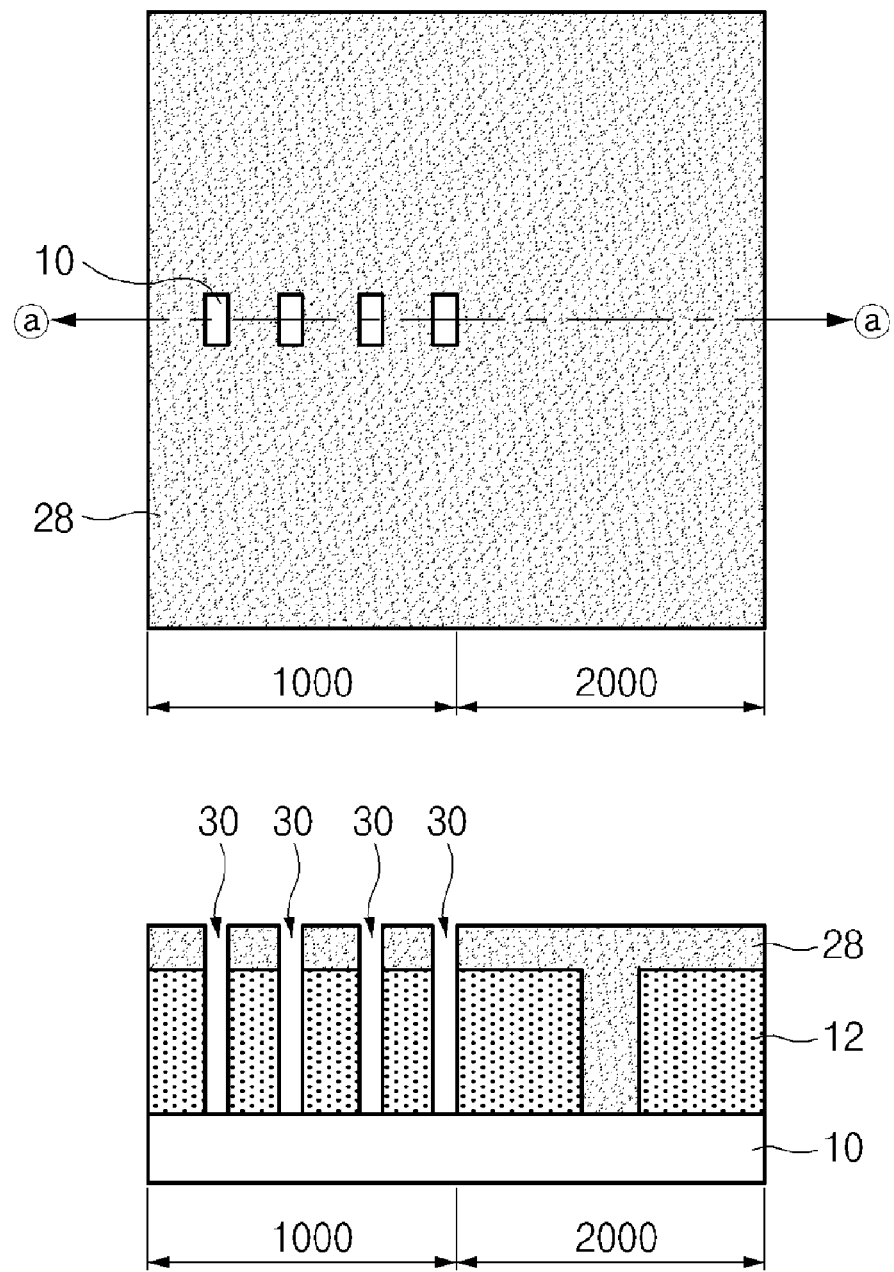

Referring to FIG. 4k, the exposed spacer 20 is removed, thereby obtaining a second hard mask 28

Referring to FIG. 4l, the underlying layer 12 in the high density region 1000 is etched using the second hard mask 28 as a mask, thereby forming the second contact hole 30 exposing the semiconductor substrate 10.

Figure 4M:
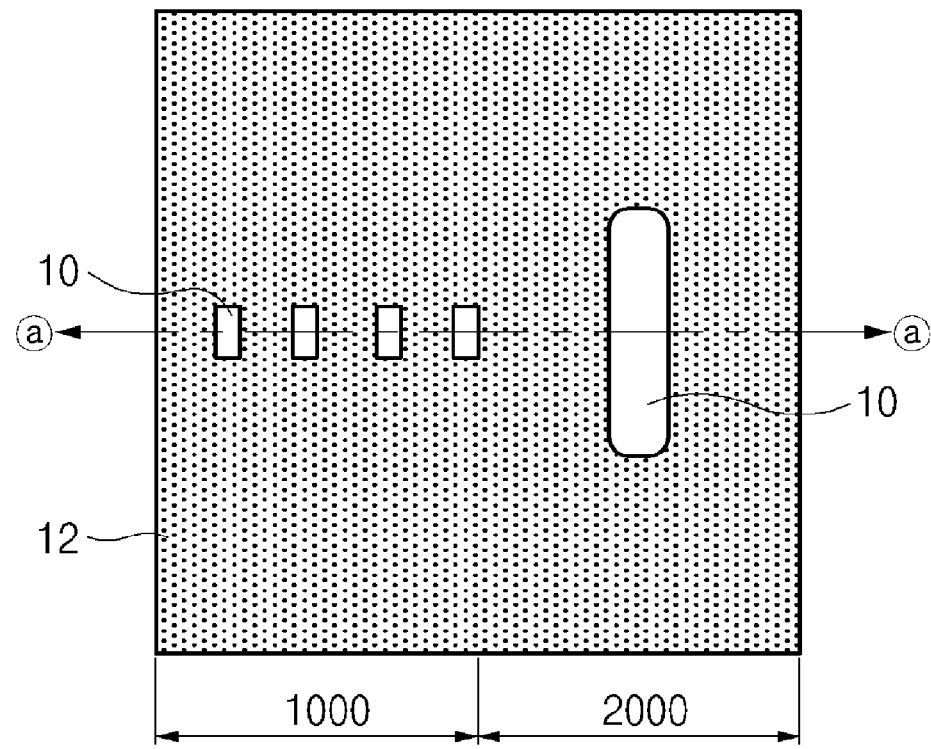
Figure 4M:
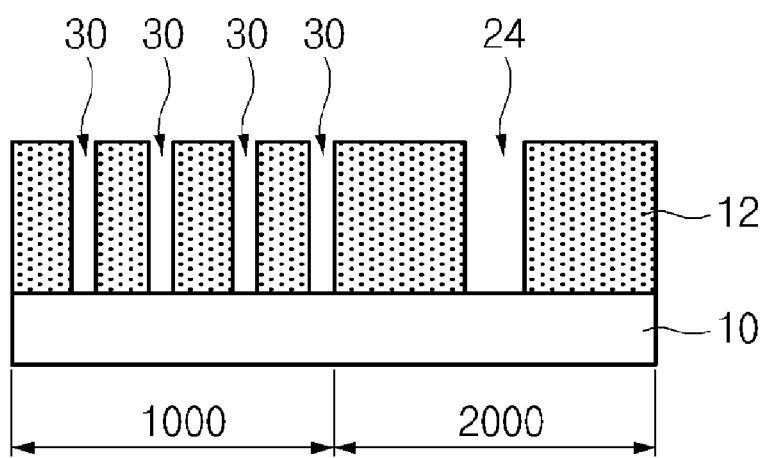

Referring to FIG. 4m, the second hard mask 28 is removed. The high density region 1000 is a region where the second contact holes 30 are provided densely, and the low density region 2000 is a region where the first contact hole 24 is provided less densely than in the high density region 1000.

Figure 5:
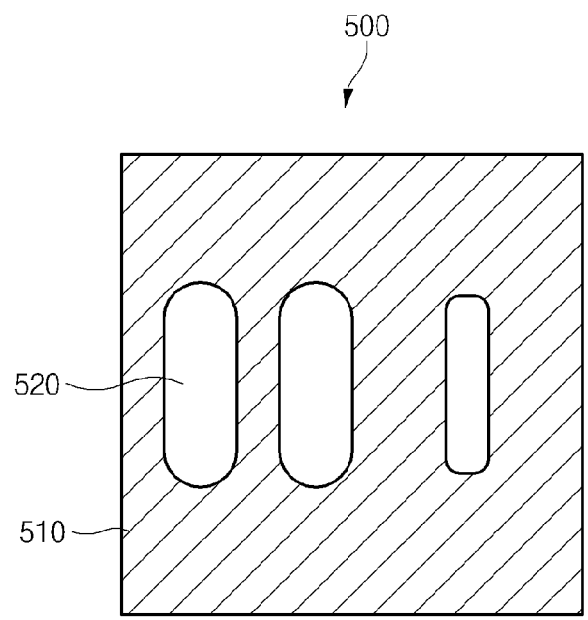
FIGS. 5 and 6 are plane views illustrating exposure masks used in a method for forming a semiconductor device according to a second embodiment of the present invention.
Figure 6:
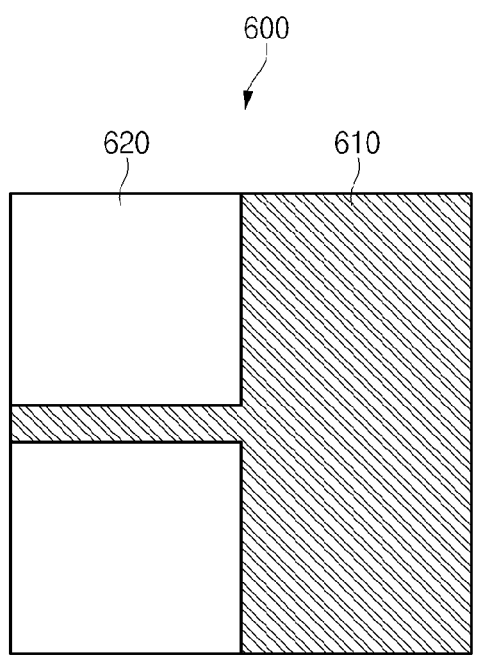

FIGS. 5 and 6 are plan views illustrating exposure masks for forming a semiconductor device according to a second embodiment of the present invention.

FIG. 5 illustrates a first exposure mask 500 designed to form first contact holes in a high density region (numeral 3000 of FIGS. 7a to 7i) on a target substrate and second contact holes in a low density region on the substrate (numeral 4000 of FIGS. 7a to 7i).

Referring to FIG. 5, a light shielding pattern 510, e.g., a chrome pattern, is provided on a transparent quartz substrate to define a light transmitting pattern 520. Here, the contact hole of the high density region is formed larger than the contact hole of the low density region, such that spacers formed on sidewalls of the first contact holes are spaced apart from each other, and spacers formed on sidewalls of the second contact holes are connected to each other to fill the second contact holes in a process forming a spacer which is a succeeding process.

FIG. 6 illustrates a second exposure mask 600, wherein a second light shielding pattern 610 is provided to shield the entire low density region (numeral 4000 of FIGS. 7a to 7i) formed using the first exposure mask 500 and the entire low density region (4000 of FIGS. 7a to 7i).

Figure 7A:
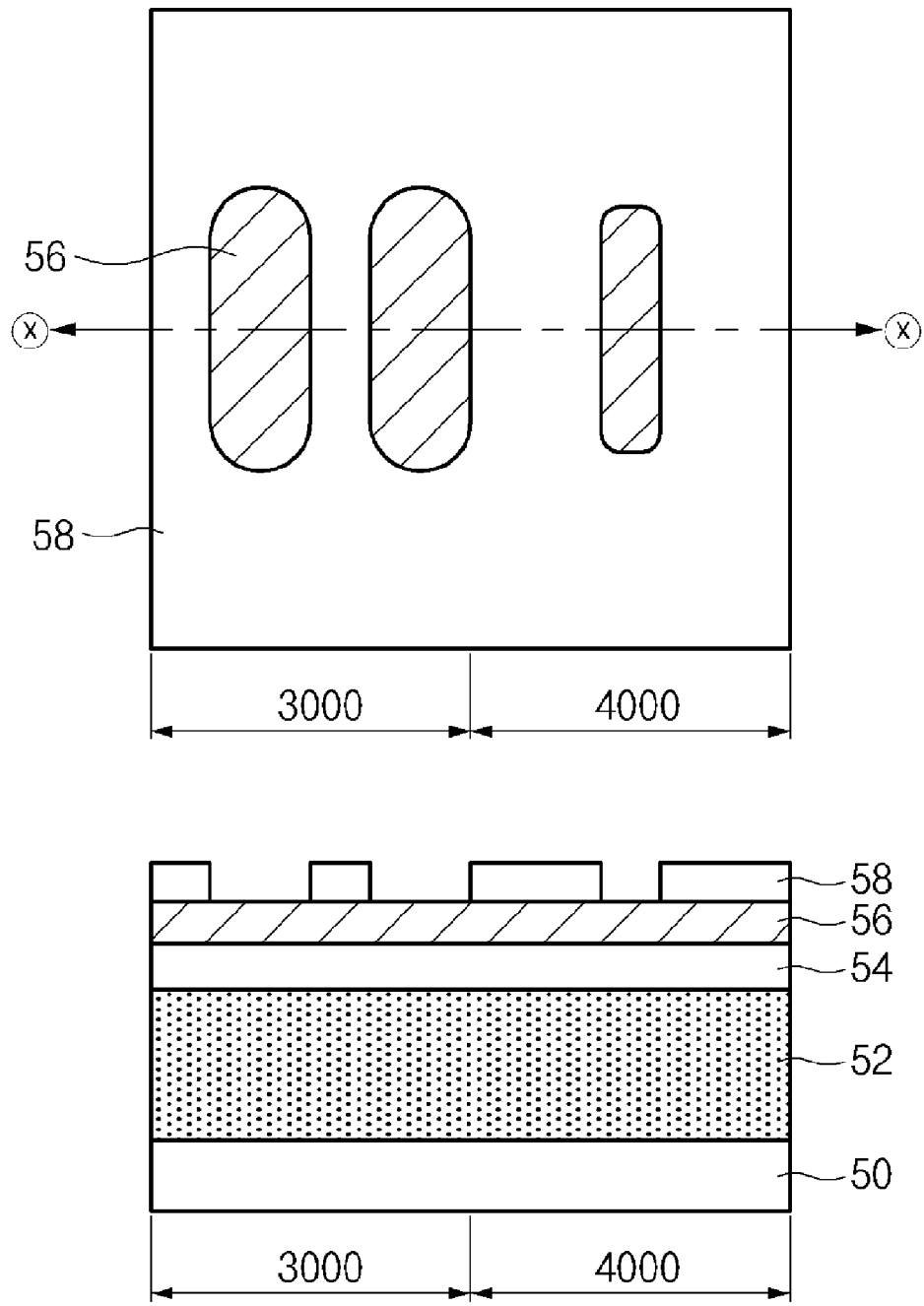
FIGS. 7a to 7i are sectional views illustrating the method for forming the semiconductor device according to the second embodiment of the present invention.
Figure 7B:
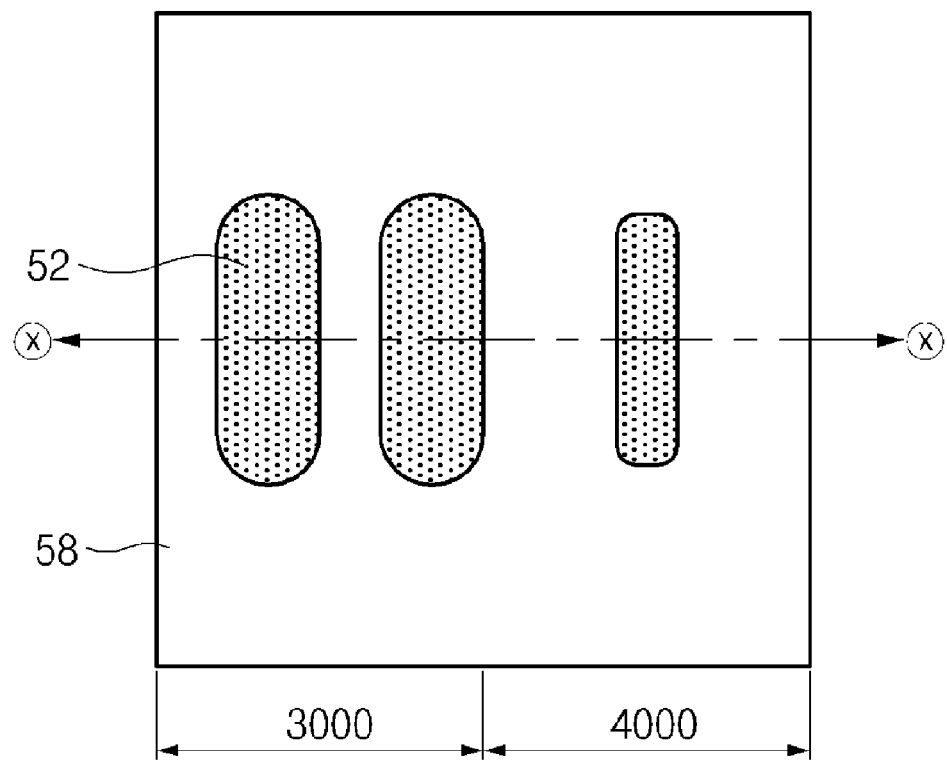
Figure 7B:
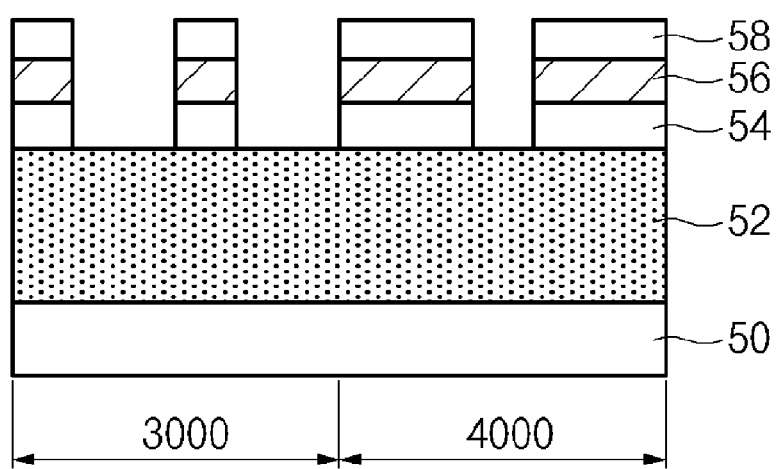
Figure 7C:
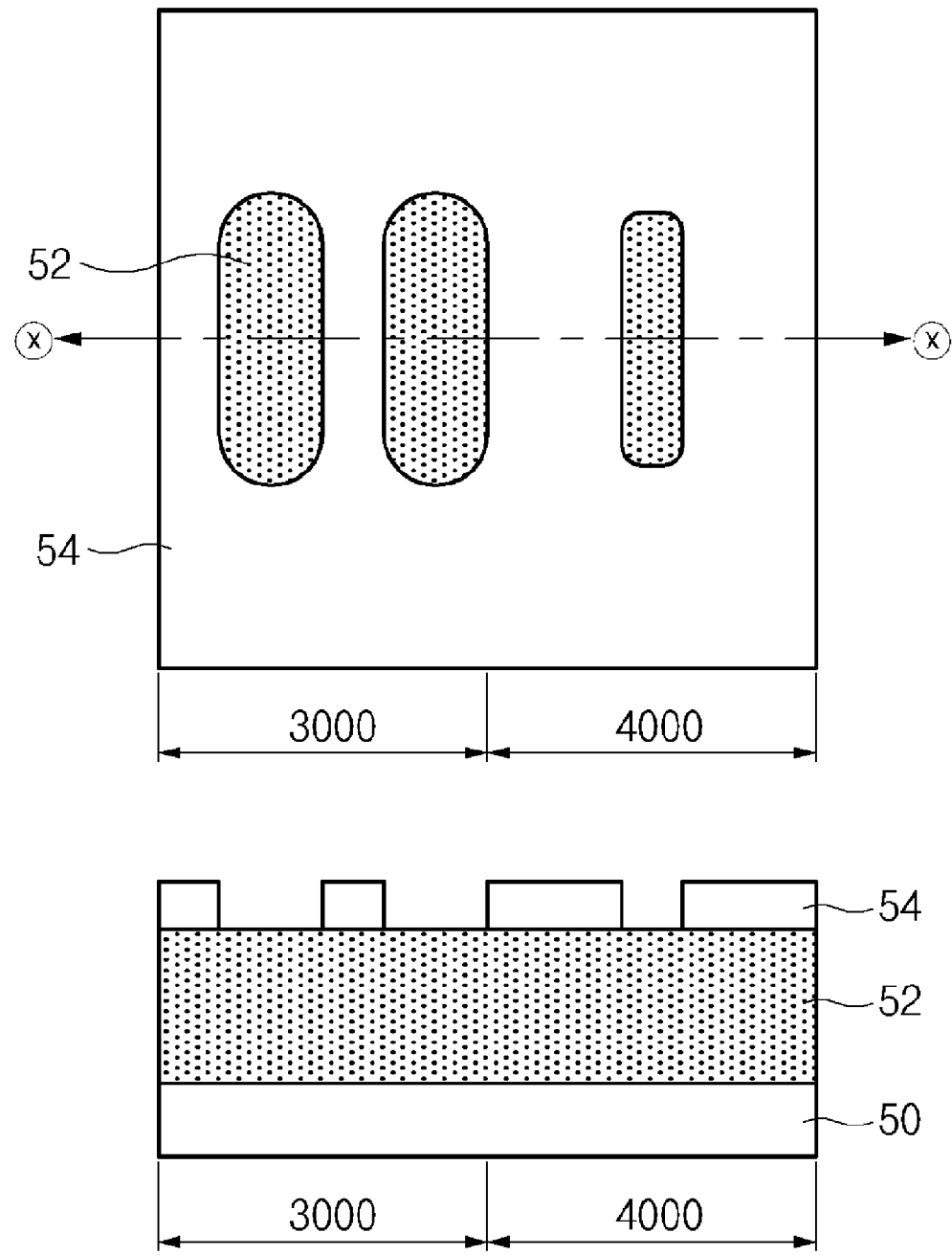
Figure 7D:
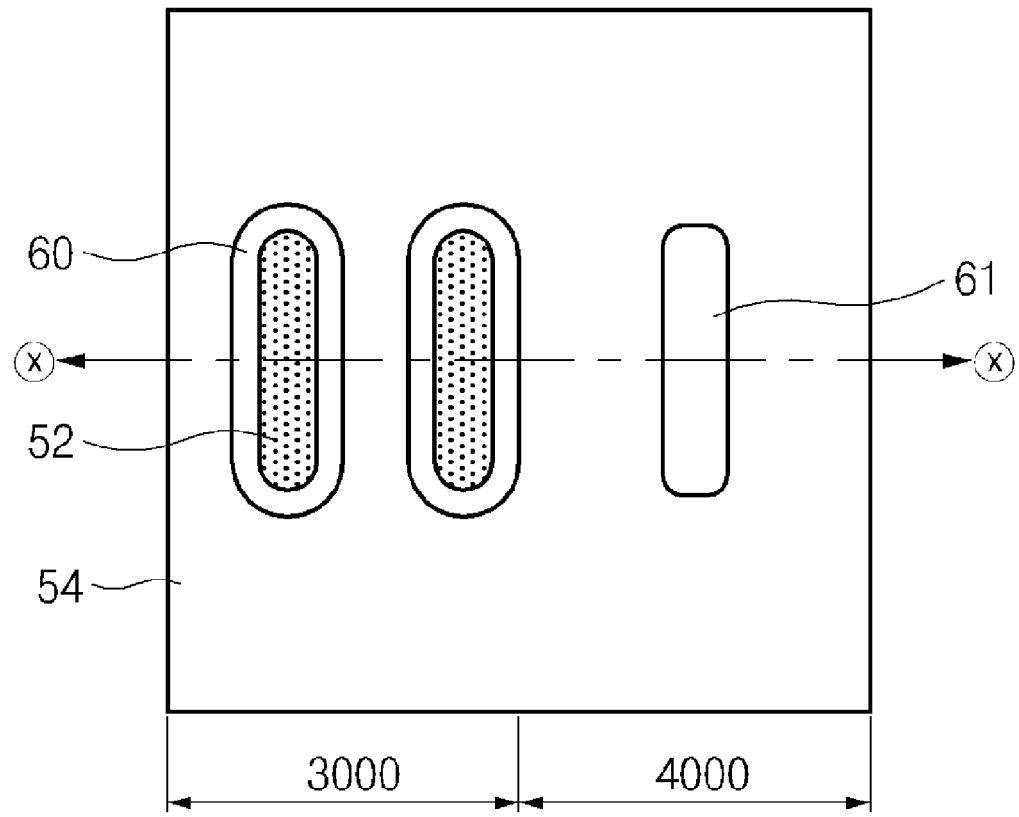
Figure 7D:
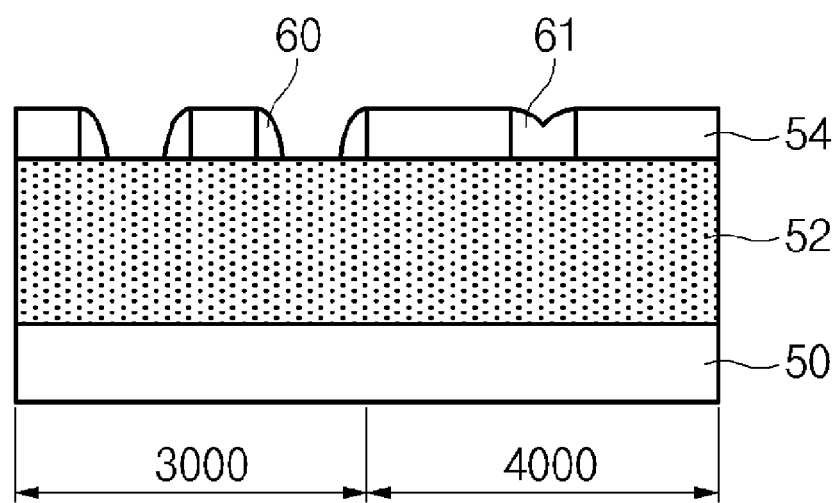
Figure 7E:
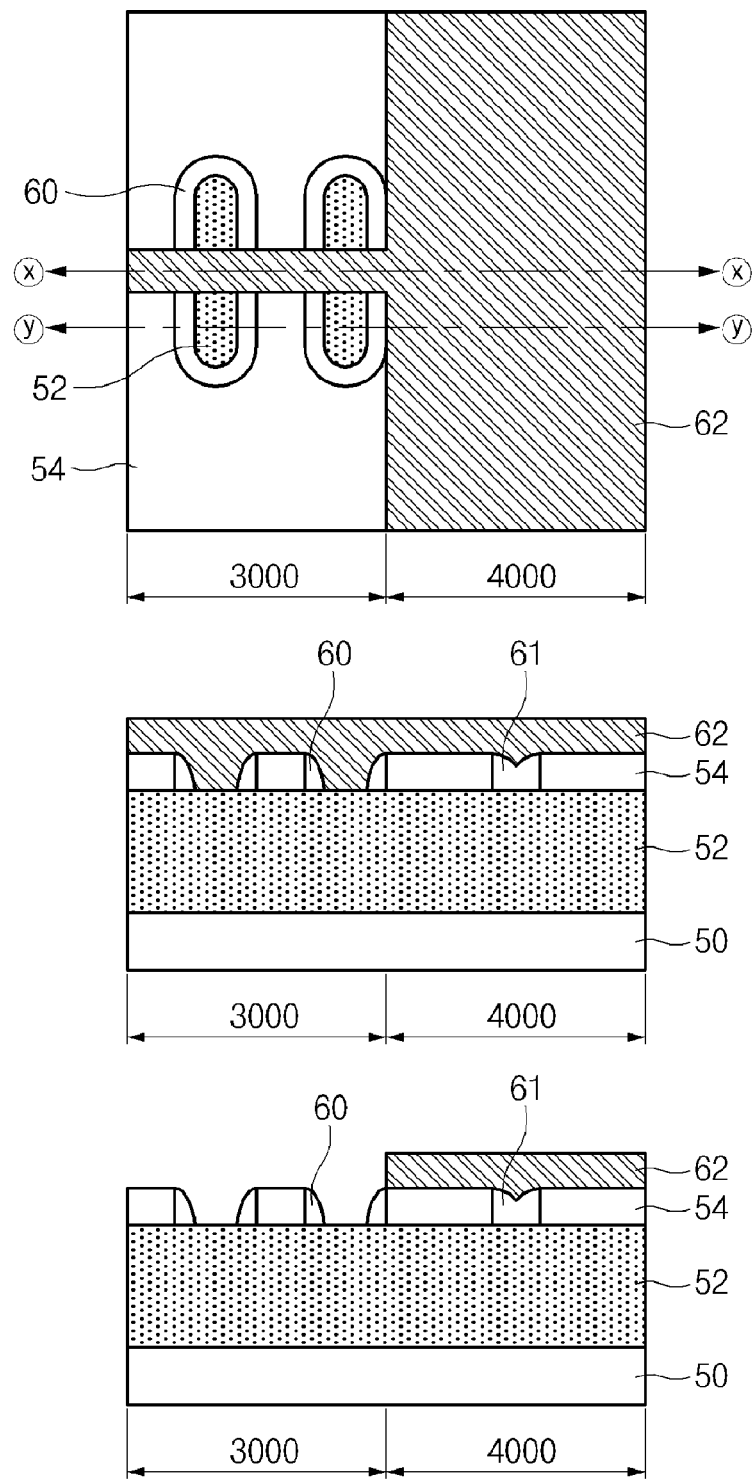
Figure 7F:
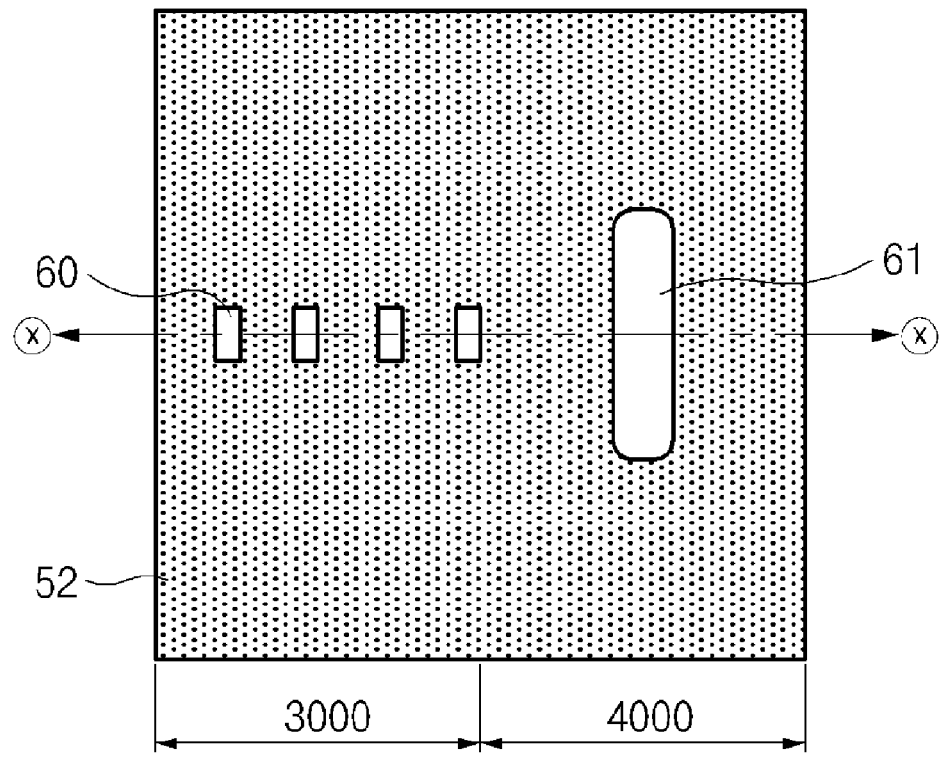
Figure 7F:
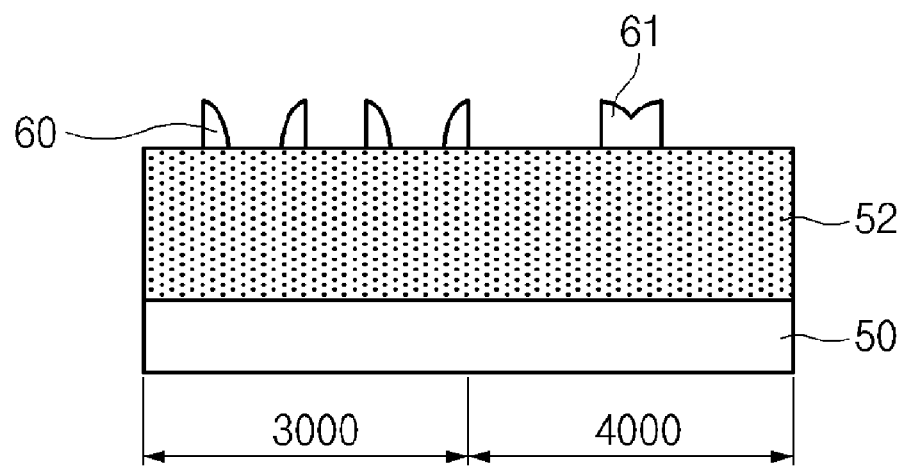

Referring to FIG. 6, in the second exposure mask 600, the light shielding pattern 610 is provided to remove the first spacer while leaving its center portion, as shown in FIGS. 7e and 7f.

FIGS. 7a to 7i are sectional views illustrating the method for forming the semiconductor device according to the second embodiment of the present invention, where the figures on the top are plan views of a target substrate and the figures on the bottom are sectional views taken along lines (x)-(x) of the plan views. In FIG. 7e, the figure on the top is a plan view of a target substrate, the figure in the middle is a sectional view taken along line (x)-(x) of the plan view, and the figure on the bottom is a sectional view taken along line (y)-(y) of the plan view. In addition, the high density region on the target substrate is denoted as numeral 3000 and the low density region on the target substrate is denoted as numeral 4000.

Referring to FIG. 7a, an underlying layer 52, a first hard mask layer 54, an anti-reflection film 56 and a first photoresist film pattern 58 are formed on a semiconductor substrate 50. Here, the first photoresist film pattern 58 is formed by an exposure and development process using the first exposure mask 500 of FIG. 5

Referring to FIG. 7b, the anti-reflection film 56 and the first hard mask layer 54 are etched using the first photoresist film pattern 58 as a mask, thereby forming an anti-reflection film 56 and a first hard mask layer 54

Referring to FIG. 7c, the first photoresist film pattern 58 and the anti-reflection film 56 are removed.

Referring to FIG. 7d, a first spacer 60 is formed on a sidewall of the first hard mask layer 54 in the high density region 3000, and a second spacer 61 filled in between neighboring first hard mask layer 54 in the low density region 4000 is formed. Specifically, a thin film of insulating material and conductive material is provided on the entire surface, and anisotropically etched to form the first and second spacers 60 and 61. The first spacer 60 is formed on the sidewall of the first hard mask layer 54 in the high density region 3000 in an elliptical shape, and the second spacer 61 is provided to fill a gap between the first hard mask layer 54 in the low density region 4000. Preferably, the insulating film is formed of an oxide material or a nitride material.

Referring to FIG. 7e, a second photoresist film pattern 62 is provided on the high density region 3000 and the low density region 4000. Here, the second photoresist film pattern 62 is formed by an exposure and development process using the second exposure mask 600 of FIG. 6 to cover the first spacer 60 in an elliptical short axis direction to cover an elliptical long axis direction central portion in the high density region 3000 and to cover the entire low density region 4000. The first spacer 60 in the high density region 3000 is etched using the second photoresist film pattern 62 as a mask, thereby forming the first spacer 60.

Referring to FIG. 7f, the second photoresist film pattern 62 and the first hard mask layer 54 are removed, thereby providing the first spacer 60 on the high density region 3000 and the second spacer 61 on the low density region 4000.

Figure 7G:
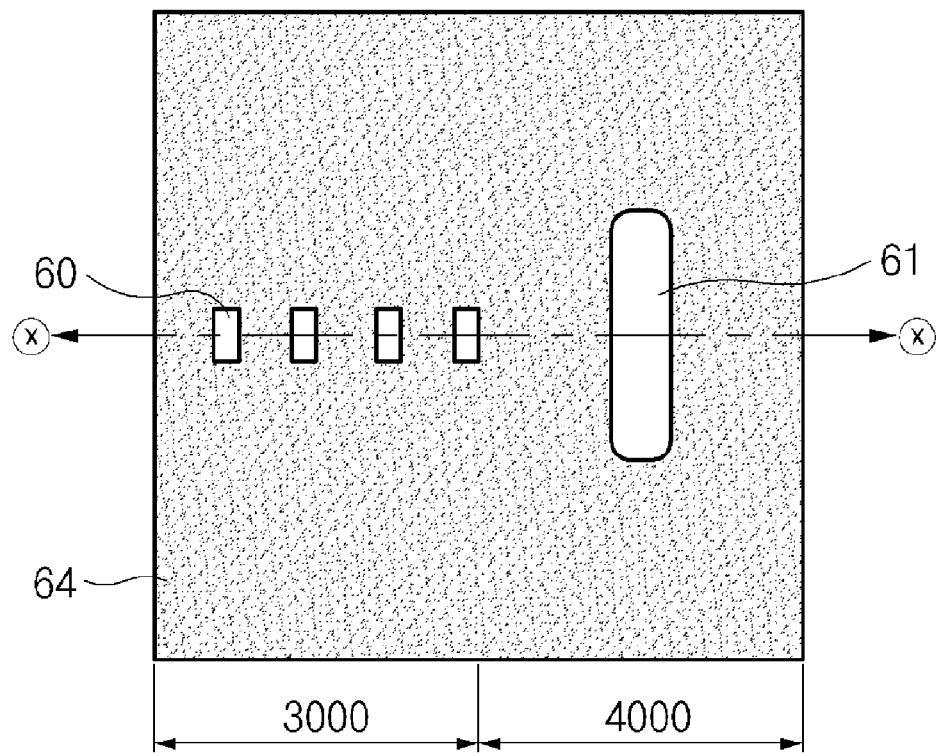
Figure 7G:
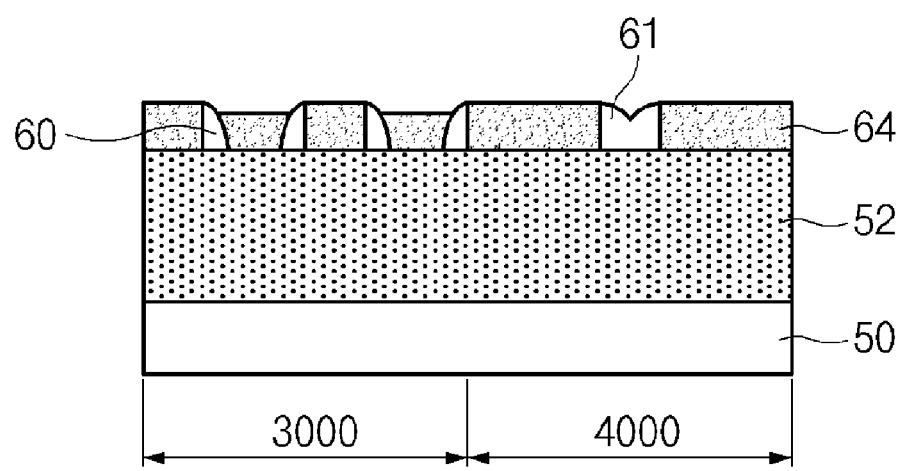

Referring to FIG. 7g, a second hard mask layer 64 is formed on the entire surface including the first spacer 60 and the second spacer 61. Thereafter, the second hard mask layer 64 is subject to planarization process to expose the first spacer 60 and the second spacer 61. The planarization process is implemented using a CMP process or an etchback process.

Figure 7H:
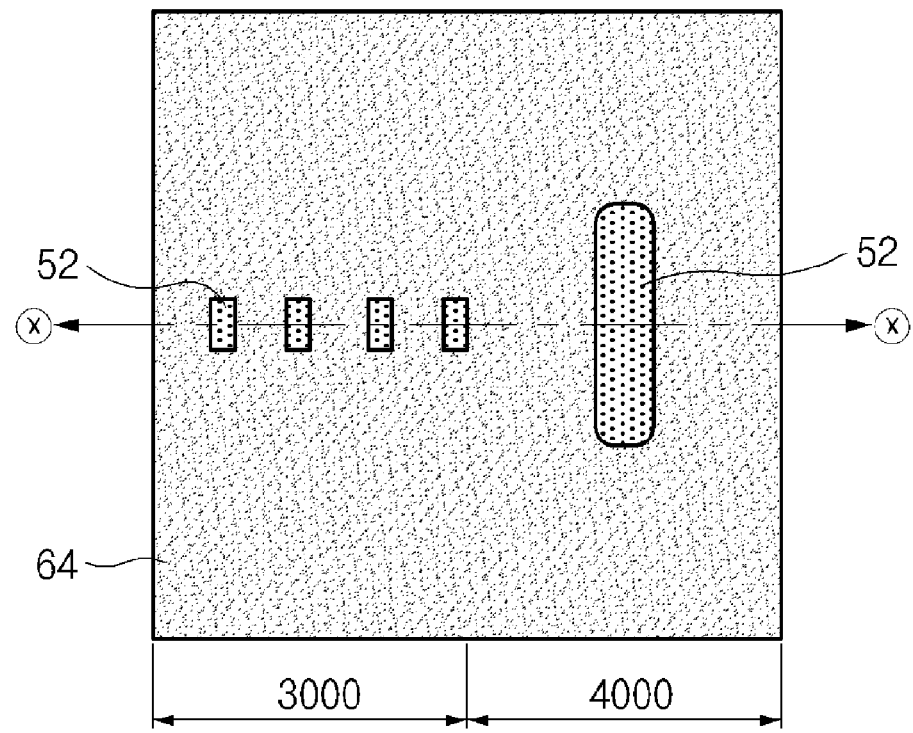
Figure 7H:
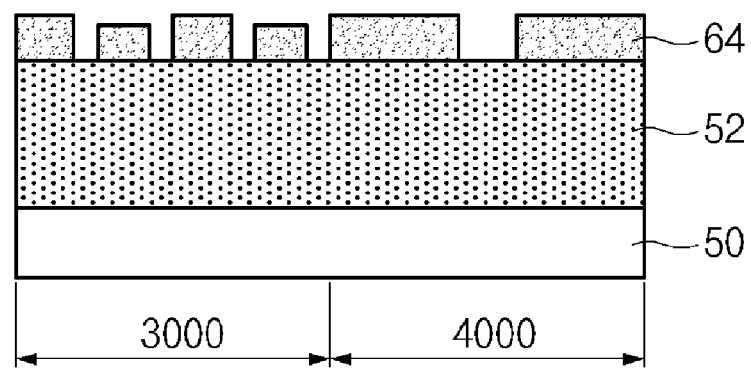

Referring to FIG. 7h, the exposed first spacer 60 and second spacer 61 are removed, thereby obtaining the second hard mask layer 64 formed on the underlying layer 52

Figure 7I:
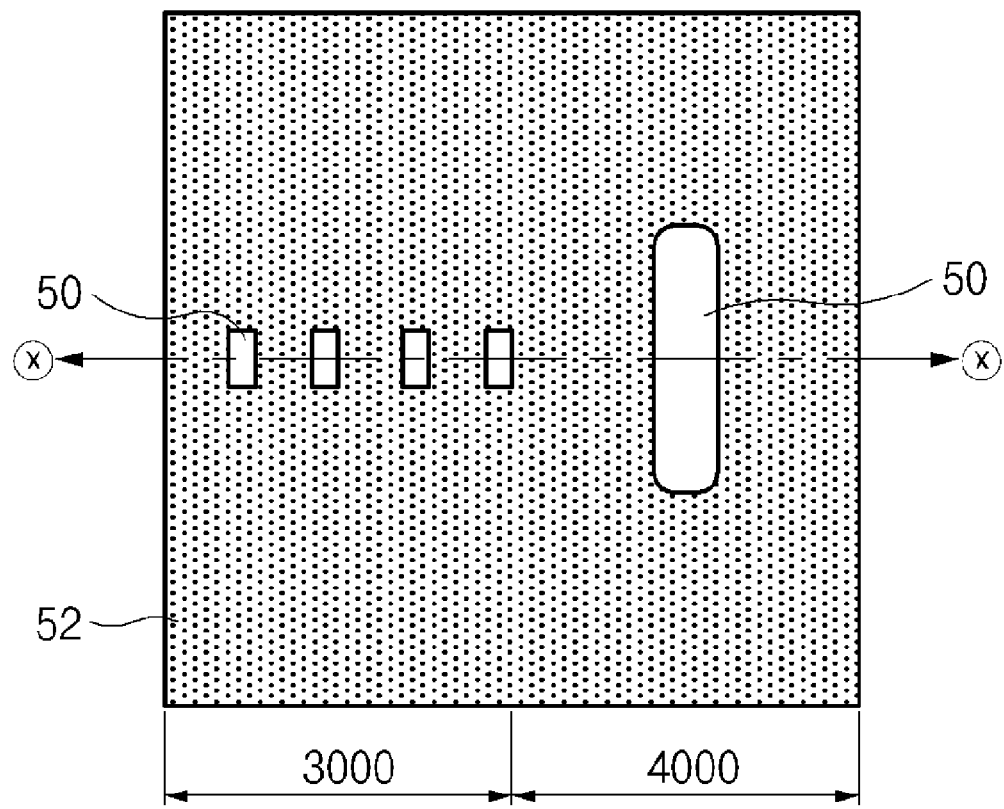
Figure 7I:
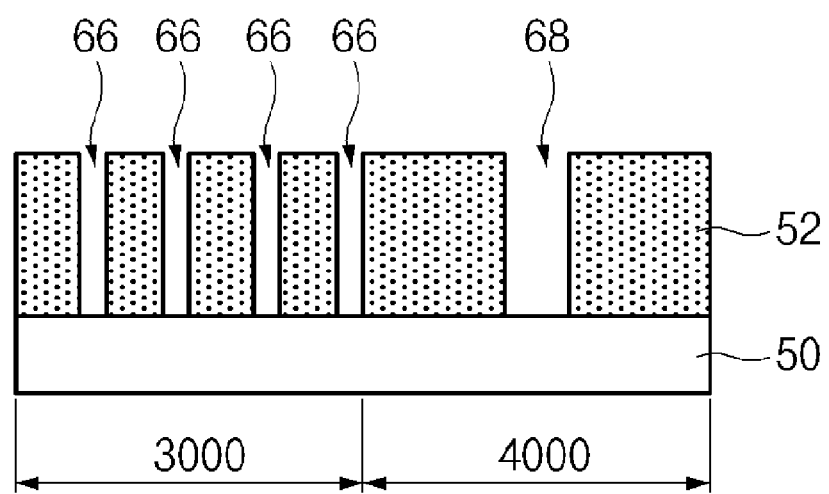

Referring to FIG. 7i, the underlying layer 52 of the high density region 3000 and the low density region 4000 is etched using the second hard mask layer 64 as a mask until the semiconductor substrate 50 is exposed, thereby forming a first contact hole 66 in the high density region 3000 and a second contact hole 68 in the low density region 4000.

As an another embodiment of the present invention is applied to a bar-type pattern formed in a high density region and a low density region, respectively. Also, it is possible to combine the second embodiment of the present invention with another embodiment. For example, a bar-type pattern is formed in a high density region and a contact hole is formed in a low density region, or vice versa.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for forming a semiconductor device, comprising:
providing a target substrate including a high density region and a low density region;
forming an underlying layer and a first hard mask layer over the target substrate;
patterning the first hard mask layer in the high density region and the low density region using a first exposure mask to form first hard mask patterns, the first exposure mask comprising a first exposure pattern formed in the high density region and a second exposure pattern formed in the low density region, wherein the first hard mask pattern in the high density region and the first hard mask pattern in the low density region have different widths;
forming a first spacer over a sidewall of the first hard mask pattern in the high density region and a second spacer filling a space between neighboring first hard mask patterns in the low density region;
etching the first spacer using a second exposure mask to form a first spacer pattern;
removing the first hard mask patterns;
forming a second hard mask layer in an opening defined by the first spacer pattern and the second spacer;
removing the first spacer pattern and the second spacer such that the second hard mask layer remains; and
etching the underlying layer using the second hard mask layer as an etch mask to form first and second target contact holes in the high density region and the low density region respectively.

2. The method according to claim 1, further comprising forming an antireflection film over the first hard mask layer.

3. The method according to claim 1, wherein the first exposure pattern and the second exposure pattern are each configured to form a contact hole pattern or a bar pattern.

4. The method according to claim 1, wherein the first and the second exposure patterns are light transmitting patterns.

5. The method according to claim 1, wherein the second hard mask layer is planarized by a CMP process or an etch-back process.

6. The method according to claim 1, wherein the first and second exposure masks are each a binary mask, a phase shift mask, or a half tone phase shift mask.

7. The method according to claim 3, wherein the contact hole pattern has an elliptical shape.

8. The method according to claim 3, wherein a width of the second exposure pattern in the low density region is less than that of the first exposure pattern in the high density region.

9. A method for forming a semiconductor device, comprising:
providing a target substance including a high density region and a low density region;
forming an underlying and a first hard mask layer over the target substrate;
patterning the first hard mask layer in the high density region and the low density region using a first exposure mask to form first hard mask patterns, the first exposure mask comprising a first exposure pattern formed in the high density region and second exposure pattern formed in the low density region, wherein first hard mask pattern in the high density region and the first hard mask pattern in the low density region have different widths;
forming a first spacer over a sidewall of the first hard mask pattern in the high density region and a second spacer filling a space between neighboring first hard mask patterns in the low density region
etching the first spacer using a second exposure mask to form a first spacer pattern;
removing the first hard mask patterns;
forming a second hard mask layer in an opening defined by the first spacer pattern and the second spacer;
removing the first spacer pattern and the second spacer such that the second hard mask layer remains; and
etching the underlying layer using the second hard mask layer as an etch mask,
wherein the first exposure pattern and the second exposure pattern are each configured to form a contact hole pattern or a bar pattern,
wherein the contact hole patter has an elliptical shape, and
wherein a width of the second exposure pattern in the low density region is less than that of the first exposure pattern in the high density region.

10. The method according to claim 9, wherein the first spacer and the second spacer are each formed of insulating material or conductive material.

11. A method for forming a semiconductor device, comprising:
providing a target substrate including a high density region and a low density region;
forming an underlying layer and a first hard mask layer over the high density region and the low density region of the target substrate;
patterning the first hard mask layer over the target substrate to form a first hard mask pattern in the high density region and a second hard mask pattern in the low density region, the second hard mask pattern having a width that is less than a width of the first hard mask pattern;
forming a second hard mask layer over the first hard mask pattern and the second hard mask pattern so that the second hard mask layer fills an opening defined by the second hard mask pattern;
patterning the second hard mask layer to form a first spacer over a sidewall of the first hard mask pattern and a second spacer filling a space between neighboring second hard mask patterns;
providing a third hard mask layer in an opening defined by the first spacer and an opening defined by the second spacer;
removing the first spacer and the second spacer to obtain a third hard mask pattern in the high density region and a fourth hard mask pattern in the low density region; and
patterning the underlying layer using the third and the fourth hard mask patterns to form a first contact hole in the high density region and a second contact hole in the low density region.

12. The method for forming a semiconductor device according to claim 11, further comprising tailoring the first spacer into a given shape and size using the second exposure mask.

13. The method for forming a semiconductor device according to claim 11, wherein the first hard mask pattern and the second hard mask pattern are each a contact hole pattern or a bar pattern.

* * * * *